(12) United States Patent
Bergeron-Mirsky et al.

(10) Patent No.: US 10,831,430 B2
(45) Date of Patent: Nov. 10, 2020

(54) VIDEO DISPLAY SYSTEMS AND METHODS

(71) Applicant: Apple Inc., Cupertino, CA (US)

(72) Inventors: William Joseph Bergeron-Mirsky, Cupertino, CA (US); James Timothy Younkin, Morgan Hill, CA (US); Jason Matthew Bond, Hong Kong (CN); Michael Min Ra, Hong Kong (CN)

(73) Assignee: Apple Inc., Cupertino, CA (US)

( * ) Notice: Subject to any disclaimer, the term of this patent is extended or adjusted under 35 U.S.C. 154(b) by 844 days.

(21) Appl. No.: 15/075,546

(22) Filed: Mar. 21, 2016

(65) Prior Publication Data

US 2017/0090849 A1 Mar. 30, 2017

Related U.S. Application Data

(60) Provisional application No. 62/234,947, filed on Sep. 30, 2015.

(51) Int. Cl.
*F16M 13/00* (2006.01)
*G06F 3/14* (2006.01)
*H05K 7/20* (2006.01)
*G09F 9/302* (2006.01)
*F16M 11/04* (2006.01)

(52) U.S. Cl.
CPC ........... *G06F 3/1446* (2013.01); *F16M 11/04* (2013.01); *F16M 13/00* (2013.01); *G09F 9/3026* (2013.01); *H05K 7/20009* (2013.01)

(58) Field of Classification Search
CPC .............................. F16M 11/10; G06F 1/1601; G06F 2200/1612

USPC ................ 248/917, 918, 919, 920, 921, 922
See application file for complete search history.

(56) References Cited

U.S. PATENT DOCUMENTS 9,848,756 B2 * 12/2017 Kan ........................ H04N 5/655
2003/0231460 A1 * 12/2003 Moscovitch ........... F16M 11/10
361/679.21

(Continued)

FOREIGN PATENT DOCUMENTS

WO 2015103079 A1 7/2015

OTHER PUBLICATIONS

"Fact Sheet CTF-700-2700D," Audipack, <https://www.audipack.com/uploads/webs_audipack_products/images/112447_112460.pdf>, dated Jul. 7, 2013.

(Continued)

*Primary Examiner* — Steven M Marsh
(74) *Attorney, Agent, or Firm* — Sterne, Kessler, Goldstein & Fox P.L.L.C.

(57) ABSTRACT

A video display system may include a video display including a plurality of video display modules, a truss supporting the video display, a lower portion of the truss anchored to a floor, and the lower portion may be coupled to the video display at a position between the terminal sides of the video display and may extend approximately one-third of the length of the video display. The video display system may include a upper portion of the truss above the lower portion and anchored to a ceiling, wherein the upper portion may be coupled to the video display at a position between the terminal sides of the video display and may extend approximately one-third of the length of the video display.

29 Claims, 31 Drawing Sheets

(56) References Cited

U.S. PATENT DOCUMENTS

| | | | |
|---|---|---|---|
| 2004/0188573 A1* | 9/2004 | Weatherly | A47B 81/061 248/125.1 |
| 2004/0188574 A1* | 9/2004 | Weatherly | A47B 81/061 248/161 |
| 2007/0103386 A1 | 5/2007 | Hara et al. | |
| 2016/0227669 A1* | 8/2016 | Kwon | H05K 7/20145 |

OTHER PUBLICATIONS

"Adapta Wall—Video Wall Structure System," Unicol, <http://www.unicol.de/userdir/media/products/ADAPTA%20WALL%20-%20STRUCTURE%20-%20ASS--20018084_2014.pdf>, dated Sep. 19, 2014.

International Search Report and Written Opinion dated Jan. 20, 2017, for International Application No. PCT/US2016/049659, ISA/EPO, Rijswijk, Netherlands.

* cited by examiner

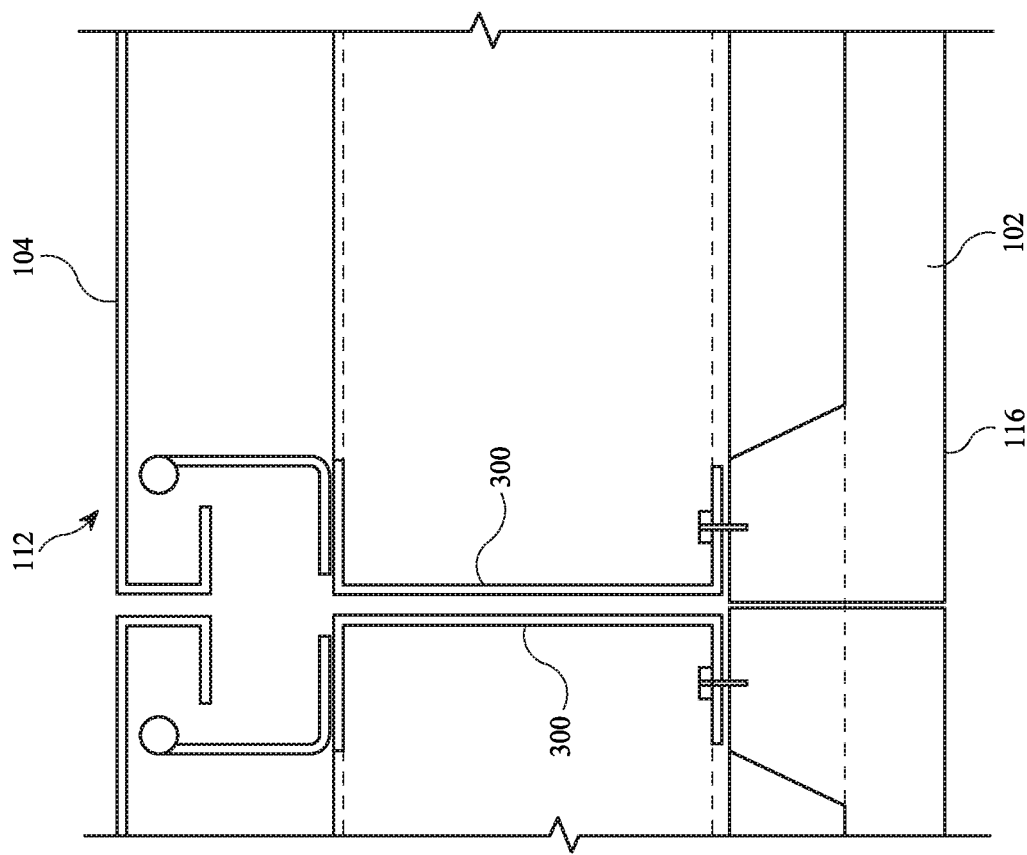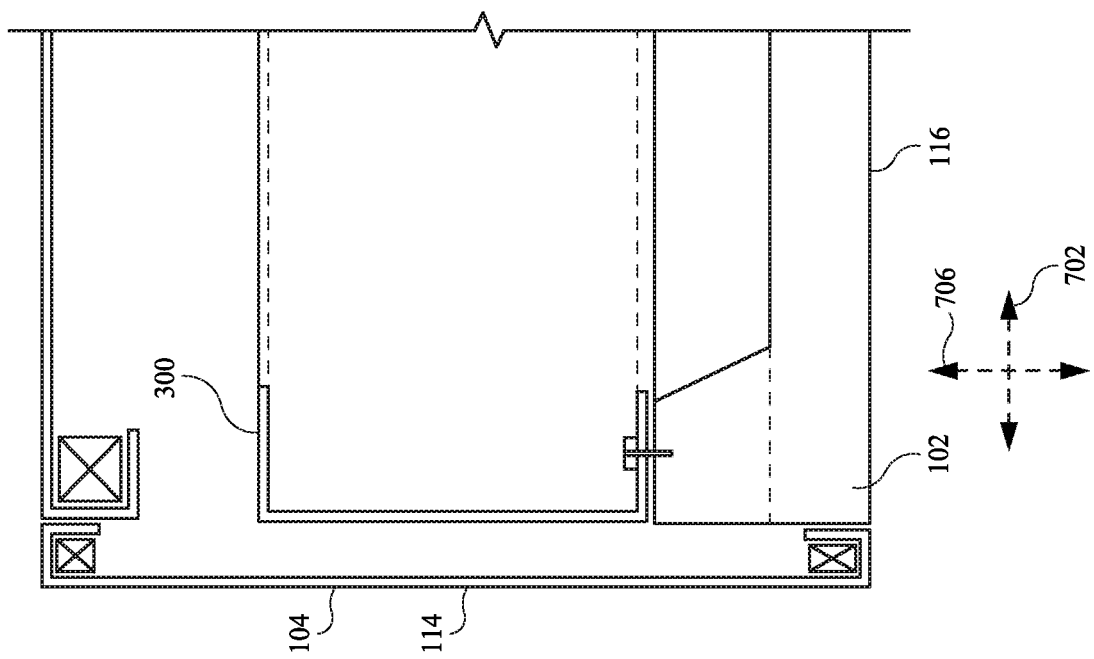
FIG. 12

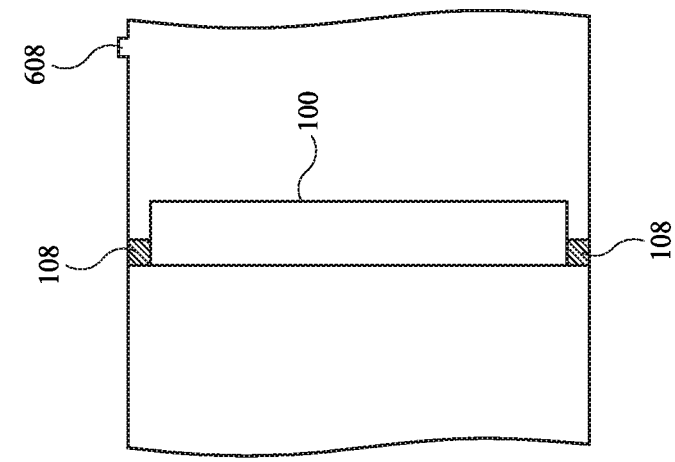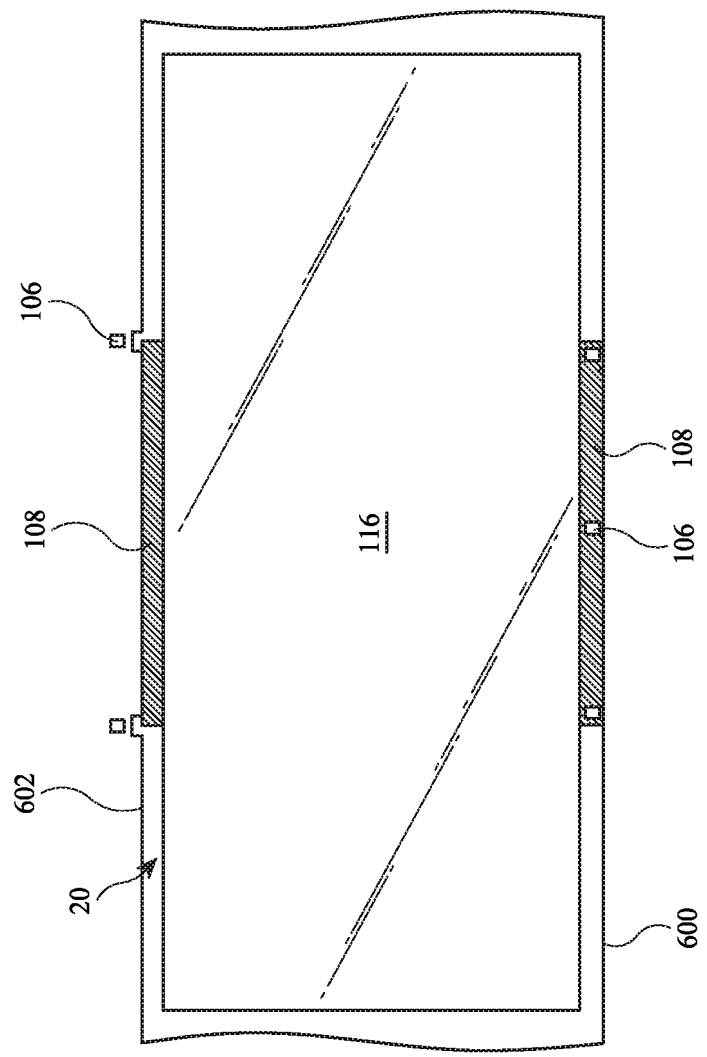
FIG. 29

VIDEO DISPLAY SYSTEMS AND METHODS

CROSS-REFERENCE TO RELATED APPLICATION(S)

This application claims priority to U.S. Provisional Application No. 62/234,947, filed on Sep. 30, 2015, which is incorporated herein in its entirety by reference thereto.

FIELD

The described embodiments relate generally to video display systems and methods.

BACKGROUND

Video display systems may be used to display video content in a variety of contexts, including in a retail environment, for example.

SUMMARY

In general video display systems have many applications, for example retail applications, educational applications, corporate applications, project management, training, and entertainment applications. In the retail environment, for example, a customer experience may be enhanced with customized content displayed on a video display along a wall, e.g., a video display wall.

Some embodiments are directed toward a video display system, including a video display including a plurality of video display modules, and a truss coupled to a rear of the video display. In embodiments, a lower portion of the truss is anchored to a floor, wherein the lower portion is coupled to the video display at a position between terminal sides of the video display and spans approximately one third of the length of the video display.

In some embodiments, an upper portion of the truss is anchored to a ceiling, wherein the upper portion is coupled to the video display at a position between the terminal sides of the video display and spans approximately one third of the length of the video display. In some embodiments, the video display is positioned entirely in front of the truss. In some embodiments, the truss may include a pair of first beams extending horizontally and parallel with a front surface of the video display, a pair of second beams extending vertically and parallel with the front surface of the video display and coupled to the first beams. In some embodiments, the system may include a cooling system. In some embodiments, the cooling system may include an air channel within at least one of the first or second beams. In embodiments, the beam may include an aperture configured to discharge air along the rear of the video display modules.

In some embodiments, a diffuser may be disposed below the video display and configured to discharge air upwardly across the screen of the video display. In embodiments, a support bracket may be coupled between the video display and the truss. In embodiments, the cooling system may include a supply air duct, and a diffuser coupled to the supply air duct and disposed below the video display and configured to discharge air upwardly across the screen of the video display. In some embodiments, a surface of the diffuser extends beyond the front of the video display. In some embodiments, an edge of the diffuser is positioned flush with the front surface of the video display.

In some embodiments, a second truss may be positioned behind and coupled to the truss, defining a space between the truss and the second truss. In some embodiments, the video display system may include an outer housing containing at least a portion of the video display system. In some embodiments, the outer housing may include a surface tapering towards the center of a rear of the video display. In some embodiments, the front surface of the outer housing is aligned with the front surface of the diffuser.

In some embodiments, the front surface of the video display is disposed forward of the lower portion of the truss. In some embodiments, the front surface of the video display is disposed forward of the upper portion of the truss. In some embodiments, the front surface of the video display is disposed forward of lower or upper portion of the truss by more than approximately 6 inches. In some embodiments, the front surface of video display is disposed forward of lower or upper portion of truss by more than approximately inches, but less than approximately 36 inches. In some embodiments, the front surface of video display is disposed forward of lower or upper portion of truss by more than approximately 8 inches, but less than approximately 24 inches. In some embodiments, the front surface of video display is disposed forward of lower or upper portion of truss by more than approximately 10 inches, but less than approximately 18 inches. In some embodiments, the front surface of video display is disposed forward of lower or upper portion of truss by approximately 10 inches.

Some embodiments include a joint system coupled to a support bracket, and the plurality of video display modules may be positioned in an array having multiple horizontal rows, and the joint system may be configured to hang the bottom row of the video display modules. In some embodiments, the horizontal rows above the bottom row are stacked on top of the bottom row and the rows below each respective horizontal row.

In some embodiments, the lower portion is coupled to the video display at a position between the terminal sides of the video display and spans less than approximately one third of the length of the video display. In some embodiments, the lower portion is coupled to the video display at a position between the terminal sides of the video display and spans more than approximately one third of the length of the video display, but less than approximately two thirds of the length of the video display. In some embodiments, the lower portion is coupled to the video display at a position between the terminal sides of the video display and spans more than approximately one third of the length of the video display but less than approximately three fourths of the length of the video display. In some embodiments, the lower portion is coupled to the video display at a position between the terminal sides of the video display and extends such that portions of video display from an end of the lower portions to the terminal sides of the video display are symmetrical along a center of the video display.

Some embodiments are directed towards a truss for supporting a video display, including a first beam including an air channel and apertures configured to allow air to flow from the air channel to an environment, a second beam configured to extend parallel with a front surface of the video display and coupled to the first beam, and a support bracket coupled to the truss and configured to support a plurality of video display modules of the video display.

Some embodiments are directed towards a cooling system for a video display, the cooling system including an air channel disposed within a beam supporting weight of the video display. In some embodiments, the beam may include apertures configured to discharge air from the air channel to a rear of the video display. In some embodiments, a diffuser is disposed below the video display. The diffuser may be configured to discharge air upwardly across a screen of the video display. A surface of the diffuser extends beyond the front of the video display in some embodiments. An edge of the diffuser is positioned flush with the front surface of the video display in some embodiments. In some embodiments, the diffuser may include a Coanda surface disposed proximate the lower edge of the video display. A return air duct disposed above the video display configured to intake air that has been discharged from the diffuser in some embodiments.

Sonic embodiments are directed towards a method for cooling a video display, including supplying an airflow vertically upwards across a front outer surface of the video display. In some embodiments, the air flows across a Coanda surface along the lower edge of the video display before flowing vertically upwards across the front of the video display.

BRIEF DESCRIPTION OF THE DRAWINGS

The disclosure will be readily understood by the following detailed description in conjunction with the accompanying drawings, wherein like reference numerals designate like structural elements, and in which:

FIG. 12 shows a partial side cut view of a video display system according to an embodiment.

FIG. 29 shows a front and side view of a video display system according to an embodiment.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the claims.

The following disclosure relates to video display systems, related systems, components and methods.

Video display systems may require large installation footprints in order to accommodate large support structures, audio and video equipment, power, and separate cooling systems required for dissipating the large amount of heat the video display wall creates. The large footprint occupies space otherwise available for other uses, such as retail sales displays. For example, conventional video display systems can extend more than 36 inches in depth. Moreover, different installation locations may include different structural configurations, limiting installation options.

Design and form factor are also considerations when implementing video display systems. Providing a pleasing aesthetic for large-scale video display systems can be a challenge, given structural requirements and packaging.

Additionally, heat dissipation requirements for such video display systems may use large ducting and diffusers, increasing the overall footprint required for installation. Some systems may utilize a supply air source that is directed from the top of the video screen wall and forces air to flow down. However, due to convection as the airflow travels across the surface of the screen, turbulence is increased and the airflow is directed away from the screen, which can result in decreased cooling efficiency and decreased comfort for individuals proximate the video display system.

Those skilled in the art will readily appreciate that the detailed description given herein with respect to the figures is for explanatory purposes only and should not be construed as limiting.

Figure 3:
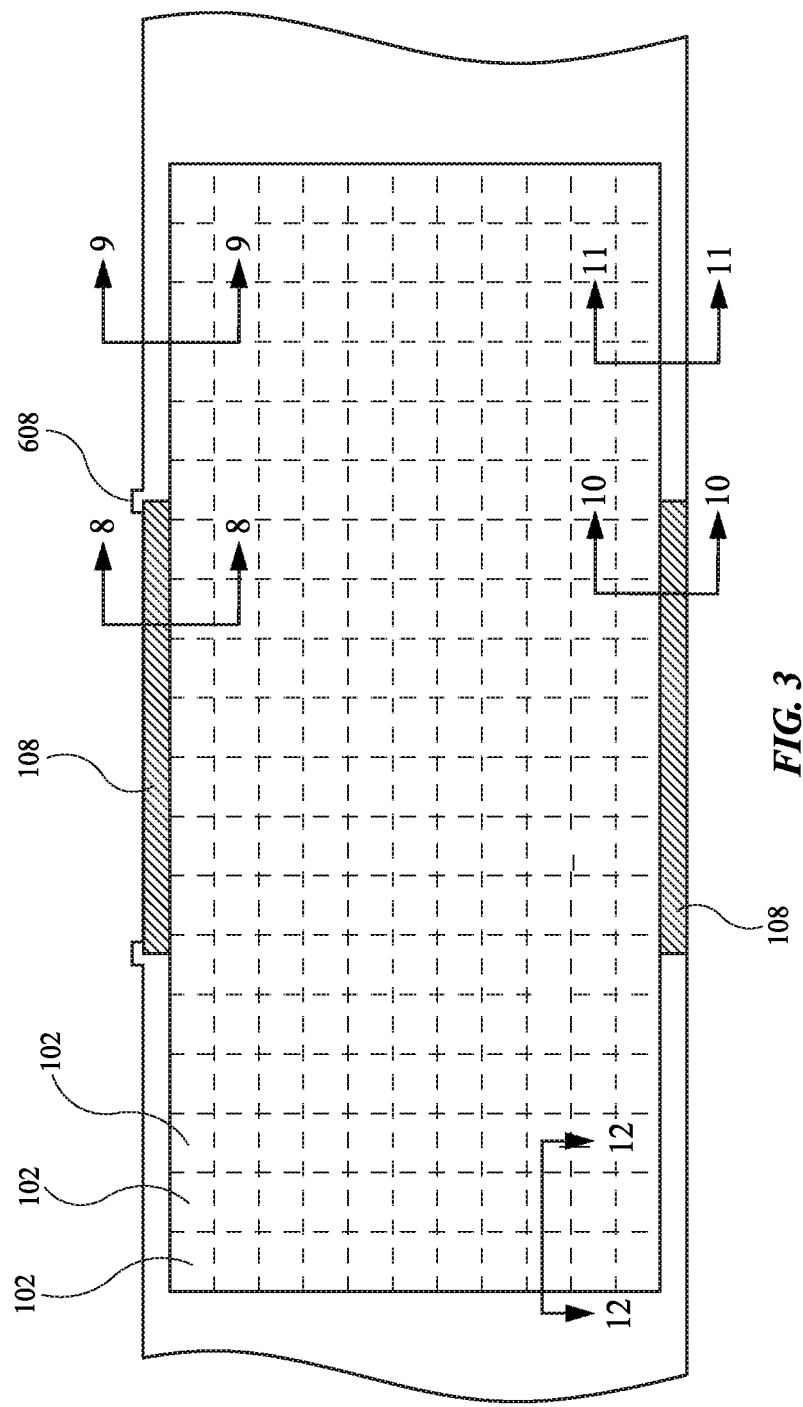
FIG. 3 shows a front view of a video display system according to an embodiment.

As shown in the figures, for example, some embodiments relate to a video display system 10, including a video display 100 which includes a plurality of video display modules 102 (as shown in FIG. 3, for example) and a truss 200 supporting video display 100. A lower portion 202 of truss 200 may be anchored to a floor 600. Lower portion 202 may be coupled to video display 100 at a position between the terminal sides 114 of the video display 100 and may extend approximately one-third of the length of video display 100. In some embodiments, the system may include an upper portion 204 of truss 200 above lower portion 202 and anchored to a ceiling 602, and second portion 204 may be coupled to video display 100 at a position between terminal sides 114 of video display 100. Video display 100 may be positioned entirely in front of truss 200 in some embodiments.

Some embodiments may include a ceiling reinforcement 610. Some embodiments may include a wall reinforcement 612. These reinforcements may be made, for example, of glass-fiber-reinforced concrete. In some embodiments, these reinforcements may be a composite structure, including for example, beams, brackets, concrete reinforcements, and the like. Some embodiments may include a ceiling channel 608. Ceiling channel 608 may, for example, be used to house portions of electronic components, such as speakers, or provide access for anchoring video display system 10.

As shown in the figures, relative dimensions of embodiments are referred to with reference to video display 100 for ease of description. A length of video display 100 extends with respect to a coordinate 700, a height of video display 100 extends with respect to a coordinate 702, a depth of video display 100 extends with respect to coordinate 704. A portion of video display 100 including screen 116 may be referred to as a front side of video display 100.

Video display 100 may be a large-scale video display. Aspects of the embodiments described herein may help to accommodate the large-scale nature of video display 10, as will be apparent to one of skill in the art. In some embodiments the height of video display 10 may be between 6 feet and 25 feet, 8 feet and 12 feet, 9 feet and 11 feet, or 10 feet. In some embodiments the length of the video display 10 may be between 10 feet and 25 feet, 14 feet and 21 feet, 16 feet and 19 feet, or 18 feet. In some embodiments the depth of the outer dimension of the video display 10 to rear surface of outer housing 104 may be less than 36 inches, less than 30 inches, less than 20 inches, less than 15 inches, or less than 10 inches. In some embodiments, the depth of the outer dimension of the screen 116 to rear surface of outer housing 104 may be 10 inches. In some embodiments, the perimeter edge of outer housing 104 may be thinner than the maximum depth. In some embodiments the edge thickness in the depth direction of the outer housing 104 may be less than 10 inches, less than 8 inches, less than 6 inches, or less than 4 inches. In some embodiments the edge thickness in the depth direction of the outer housing 104 may be 4 inches. As discussed above, design and form factor are also considerations when implementing video display systems.

Providing a pleasing aesthetic and compact form factor for a large-scale video display system can be a challenge. In some embodiments, the proportion of the truss structure and selection of video display system 10, 20, 30, or 40, may be configured in relation to one or more of the video display 100 dimensions, outer housing 114 dimensions, component module housing 108 dimensions, or other environmental dimensions. For example, if the video display 100 is relatively small and the ceiling height is relatively small, the environment may call for the wall mounting of video display system 40. However, as screen size increases along with ceiling height, video display systems 10, 20, and 30 may be selected. These scalable dimensions convey similar form factors and visual appearances.

In some embodiments, the height of component module housing 108 may be between 3 inches and 24 inches, 4 inches and 20 inches, 5 inches and 15 inches, or 6 inches and 10 inches.

Figure 1:
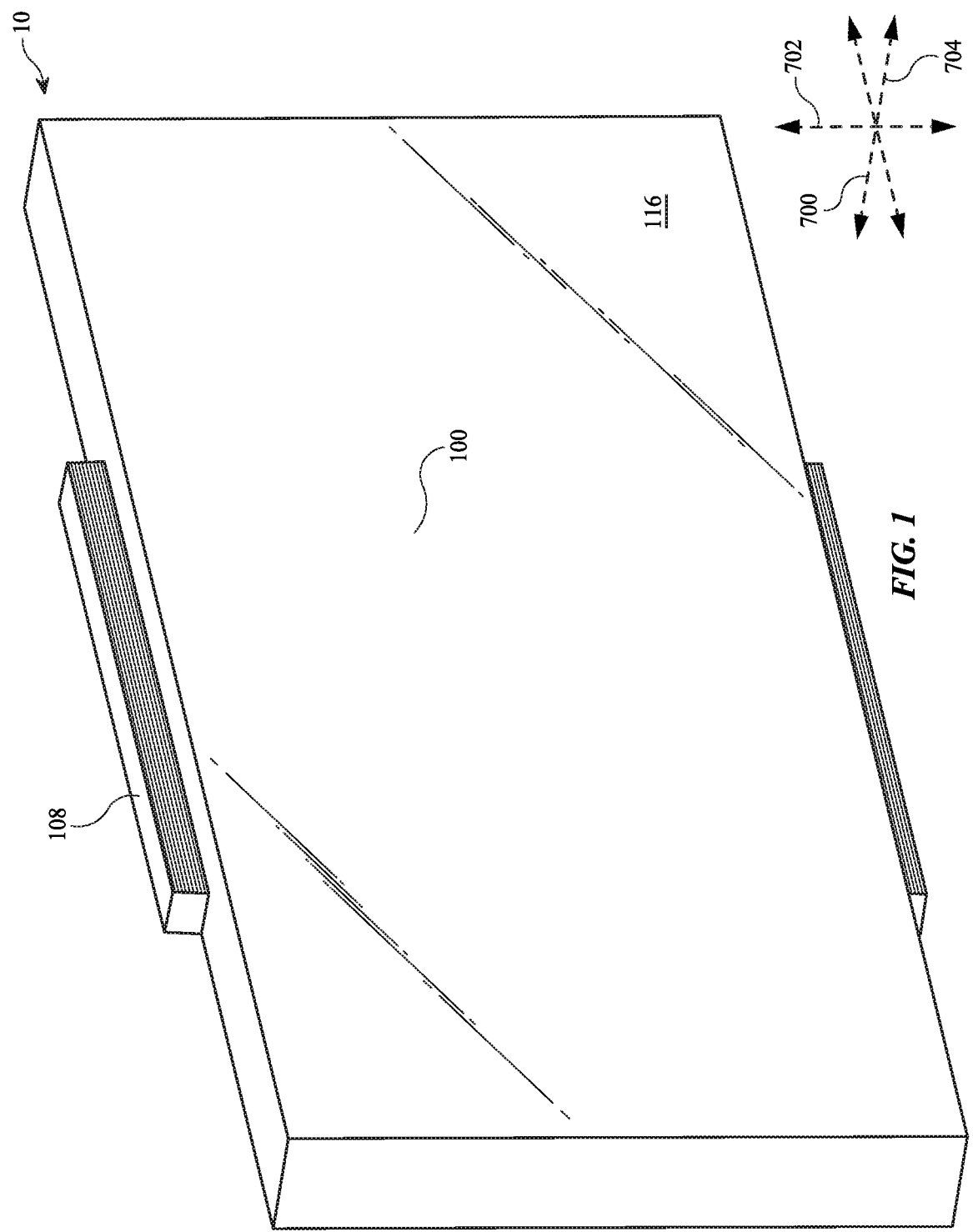
FIG. 1 shows a front perspective view of a video display system according to an embodiment.
Figure 6:
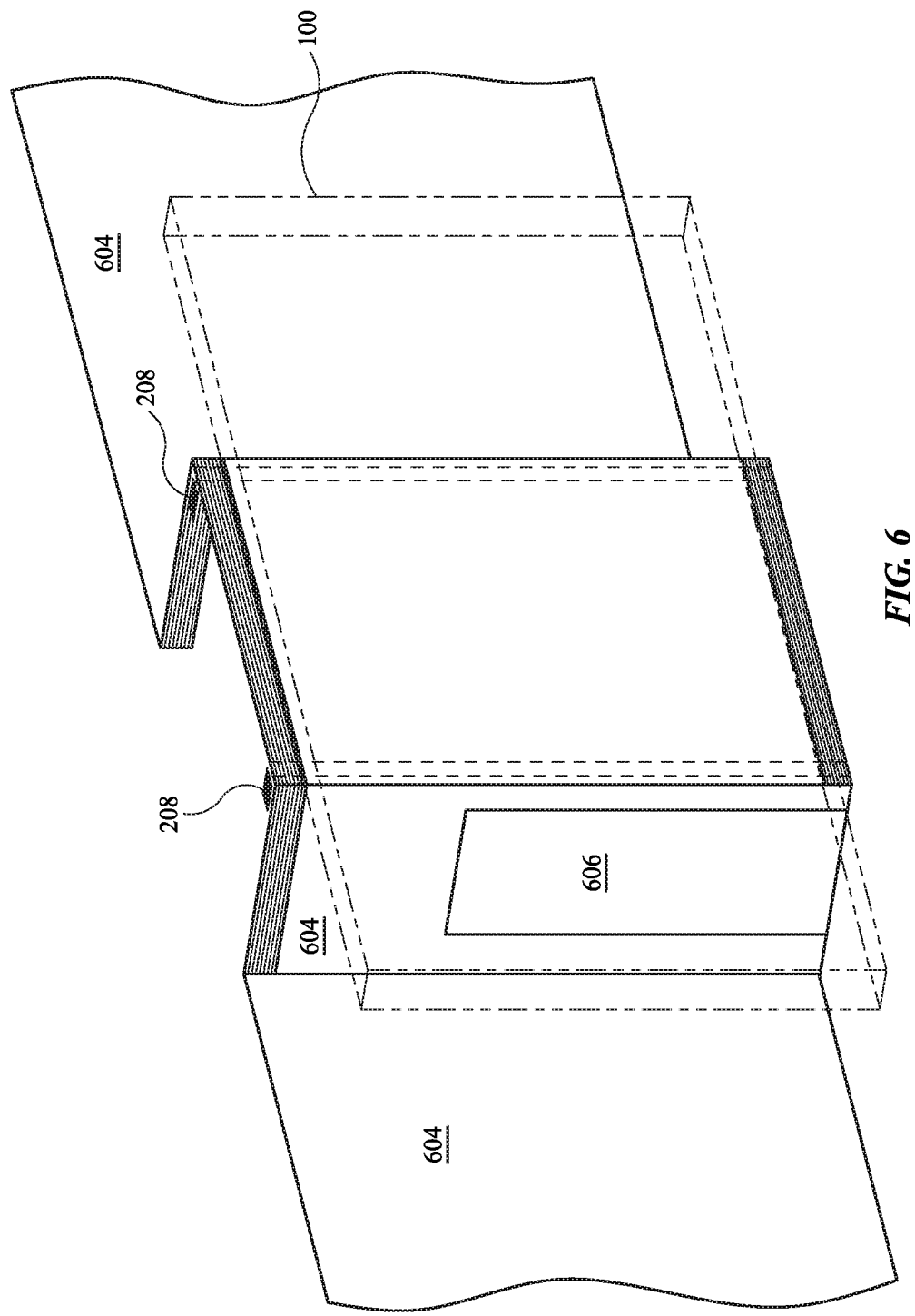
FIG. 6 shows a front perspective view of a video display system according to an embodiment.

Referring generally to FIGS. 1 and 6, the positioning of truss 200 behind the video display 100 results in the video display 100 being cantilevered forward. In some embodiments, video display 100 may appear cantilevered forward from a surface of component module housing 108 by between 3 inches and 24 inches, 4 inches and 20 inches, 5 inches and 15 inches, 6 inches and 12 inches, or approximately 10 inches. In some embodiments, the front surface of video display 100 is disposed forward of lower or upper portion 202/204 of truss 200 by more than approximately 6 inches. In some embodiments, the front surface of video display 100 is disposed forward of lower or upper portion 202/204 of truss 200 by more than approximately 6 inches, but less than approximately 36 inches. In some embodiments, the front surface of video display 100 is disposed forward of lower or upper portion 202/204 of truss 200 by more than approximately 8 inches, but less than approximately 24 inches. In some embodiments, the front surface of video display 100 is disposed forward of lower or upper portion 202/204 of truss 200 by more than approximately 10 inches, but less than approximately 18 inches. In some embodiments, the front surface of video display 100 is disposed forward of lower or upper portion 202/204 of truss 200 by approximately 10 inches.

Figure 2:
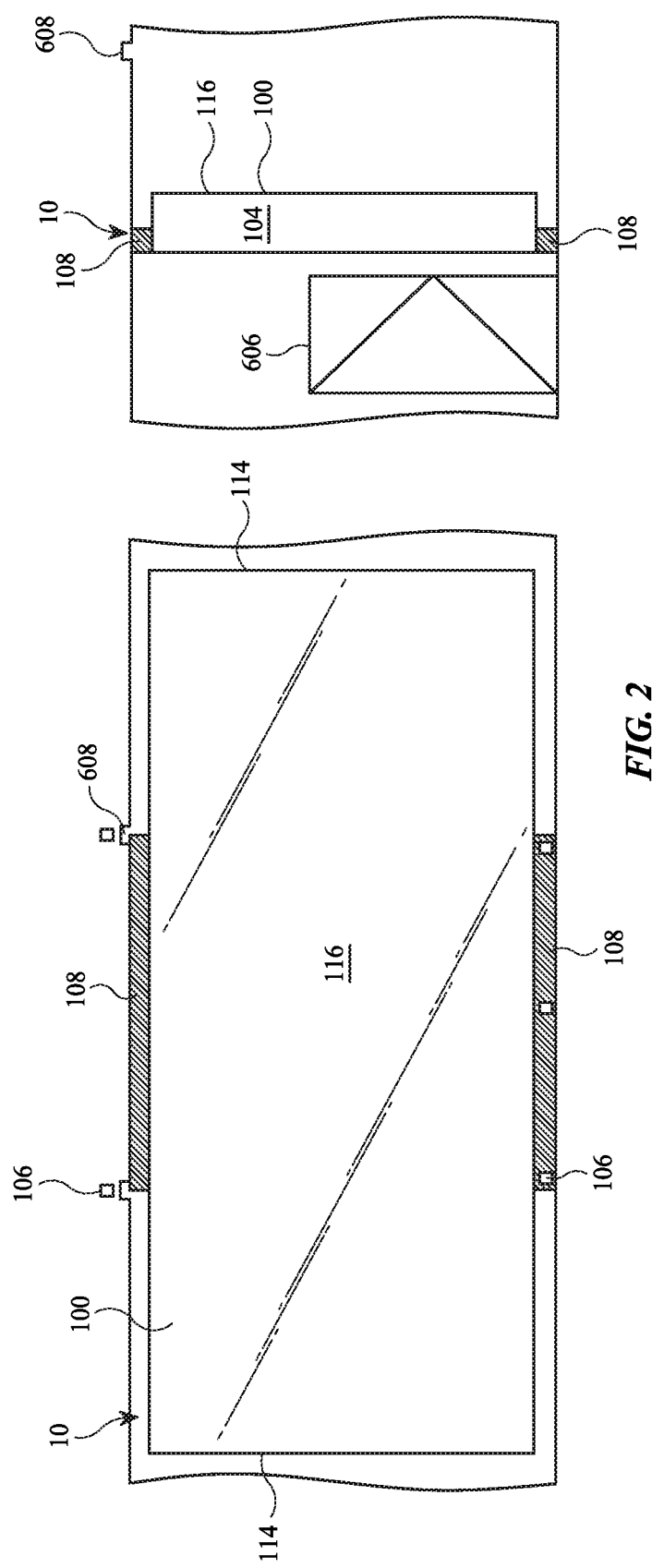
FIG. 2 shows a front and side view of a video display system according to an embodiment.

In some embodiments, upper portion 204 of truss 200 may be above lower portion 202 and may extend approximately one-third of the length of video display 100. As used herein, "approximately" may be taken to mean within 10% of the recited value, inclusive. In some embodiments, a component module housing 108 may house portions of truss 200. In some embodiments, component module housing 108 may appear to be acting as a support for video display 100. As discussed, FIGS. 1 and 2, for example, illustrate the visual effect created with video display wall 100 appearing cantilevered about component module housing 108. The relative proportions of visible structure, along with their placement is advantageous as it increases the compactness of the overall footprint. Additionally, the relative proportions of visible structure and their placement contributes to a sleek, expansive, unencumbered visual impression, increasing the aesthetics of the system. In some embodiments, component module housing 108 may appear to support video display 100 in a cantilevered fashion. FIG. 2 additionally illustrates various locations for speakers 106, for example within component module housing 108, which may include perforations 110. Component module housing 108 may also enclose a portion of truss 200, or other related electronics or mechanical equipment included in video display system 10 or video display 100, to contribute to the compactness of video display system 10 or video display 100.

Figure 4:
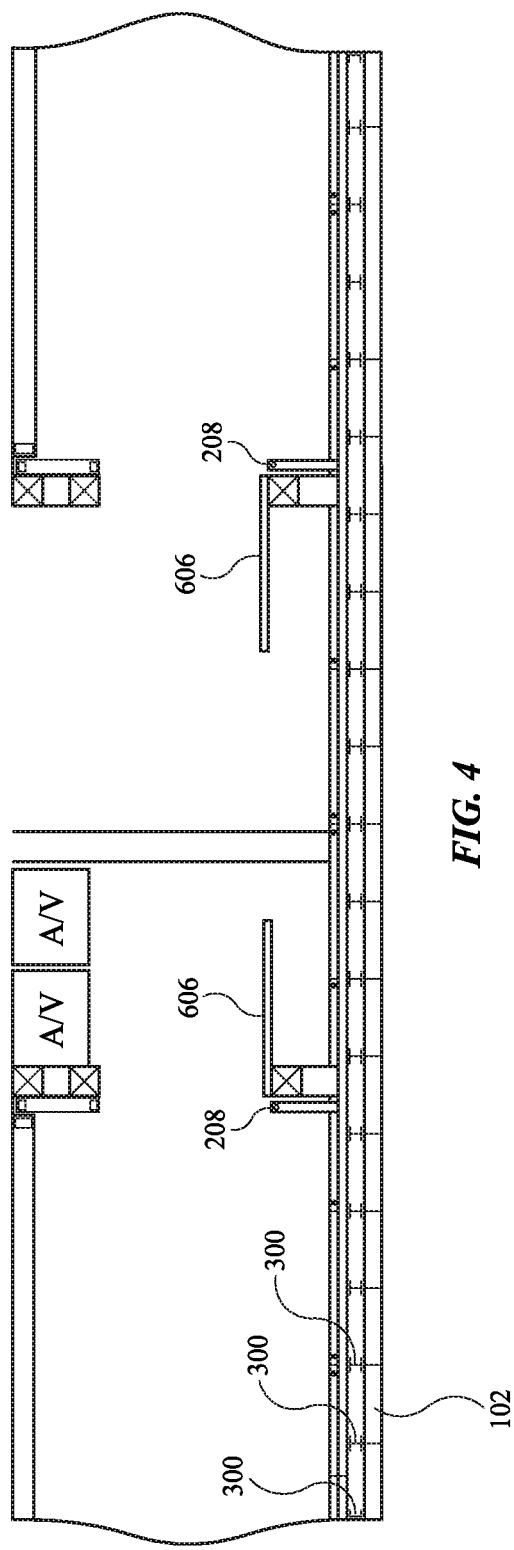
FIG. 4 shows a top view of a video display system according to an embodiment.

As shown in FIGS. 2 and 4, a door 606 may be behind video display system 10, which may lead to a secondary area, such as a stock room, or an access room for maintaining and accessing components of video display system 10, such as audio or visual components (e.g., "AV"). For example, this area may be a "back of house" area in a retail setting. Since such an area may be behind video display system 10, the compactness of video display system 10 minimizes impeding on this area, thereby contributing an efficient use of space. FIG. 3 shows channel 608, which video display system 10 may be positioned relative to in order to take advantage of structural or architectural features provided in an installation environment. For example, ceiling channel 608 may house speakers 106, or air ducts, for example. As shown in FIG. 4, there may include a plurality of doors 606 leading to different secondary areas. In some embodiments, one of the lower and upper portion 202/204 of truss 200 may be integrated into a wall 604.

Figure 5B:
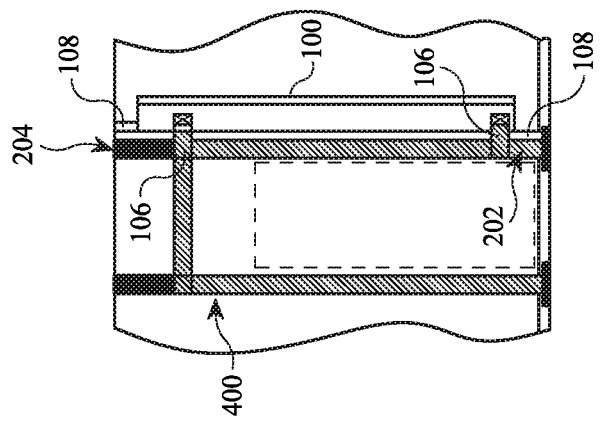
FIG. 5B shows a side cut view of a video display system according to an embodiment.
Figure 5A:
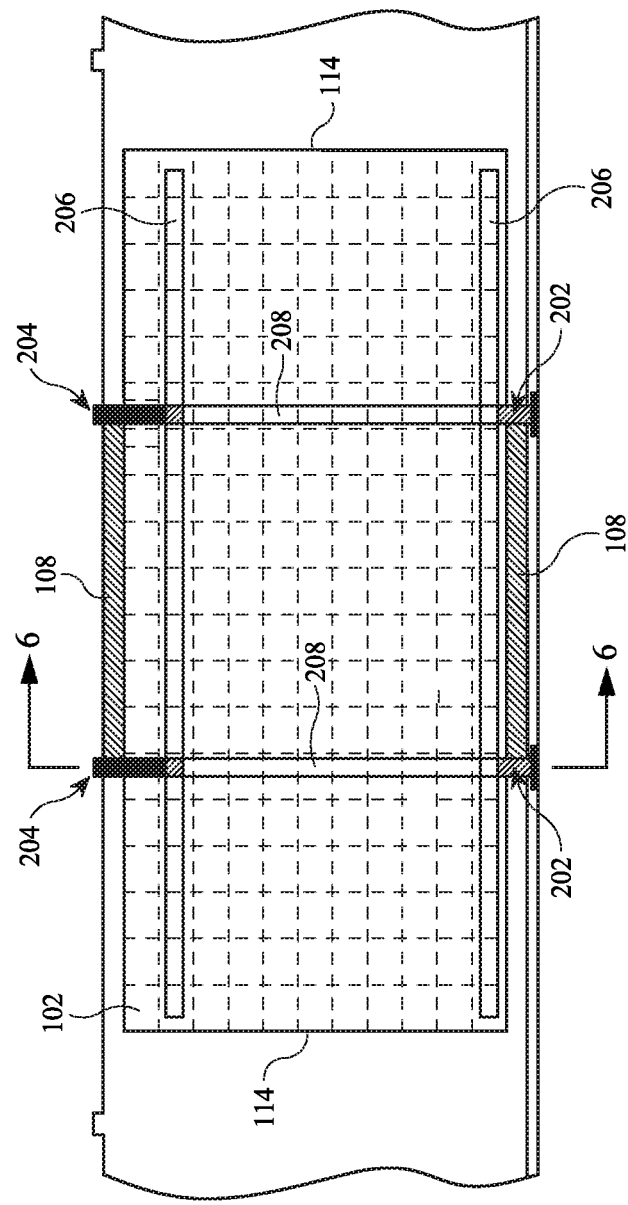
FIG. 5A shows a front cut view of a video display system according to an embodiment.
Figure 7:
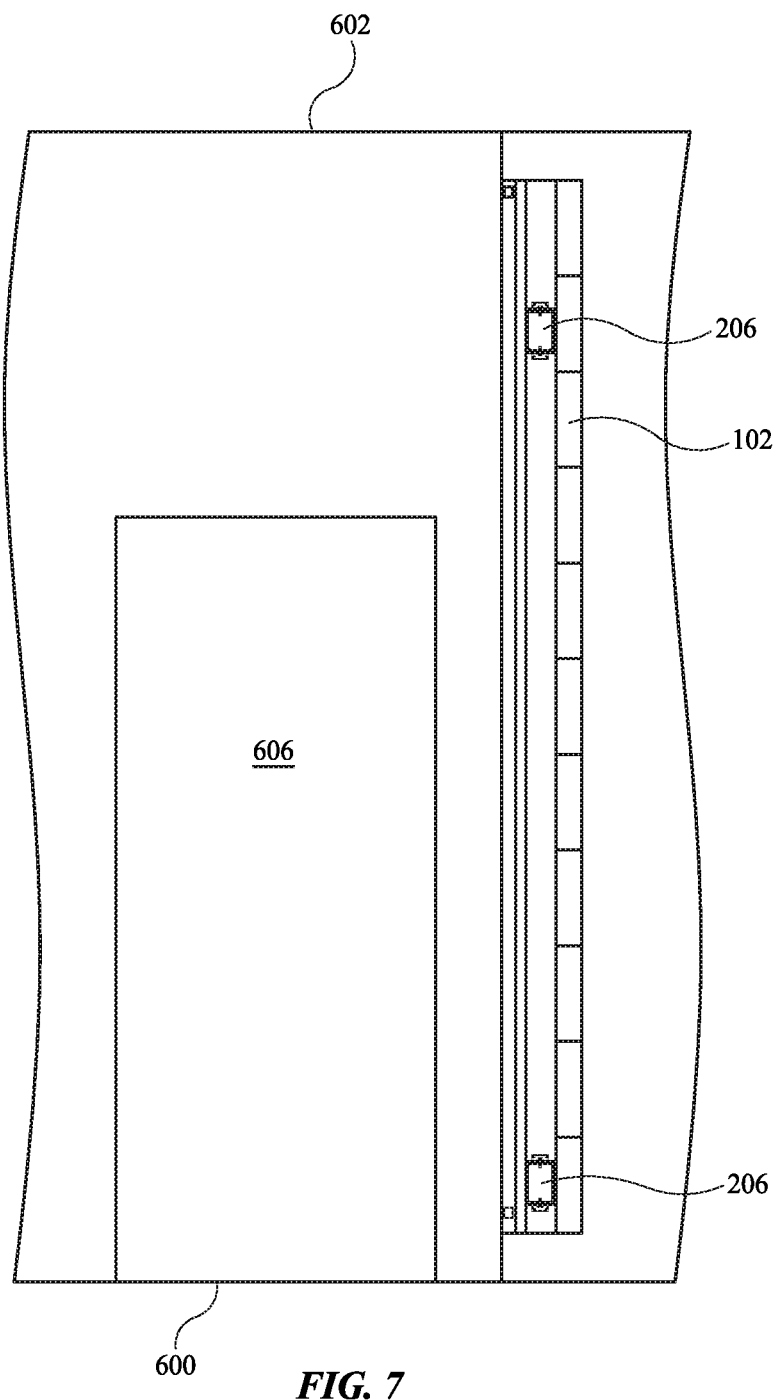
FIG. 7 shows a schematic side view cut view of a video display system according to an embodiment.

FIGS. 5A and 5B show schematic section views of video display system 10. As shown in FIGS. 5A and 5B, for example, in some embodiments, truss 200 may include a pair of first beams 206 extending horizontally and parallel with a front surface of the video display 100, a pair of second beams 208 extending vertically and parallel with the front surface of the video display 100 and coupled to the first beams. Lower portion 202 may be coupled to video display 100 at a position between the terminal sides 114 of the video display 100 and may extend approximately one third of the length of the video display 100. In some embodiments, upper portion 204 of truss 200 may be positioned above lower portion 202 and anchored to a ceiling 602, and upper portion 204 may be coupled to video display 100 at a position between terminal sides 114 of video display 100. FIG. 7 shows a schematic side view cut view of a video display system according to an embodiment. Additional beams may be included in some embodiments, in order to serve as intermediate structure of the first or second truss. The beams may be coupled in a releasable fashion, for example, with a bracket system. The beams may be coupled in a fixed fashion, for example, by welding. The beams may be coupled such that there may be additional trusses, and may be coupled in both a releasable fashion and a fixed fashion. Truss 200 may include additional beams. The beams may be coupled together, for example, with a bracket system, welding, or other suitable coupling.

Figure 8:
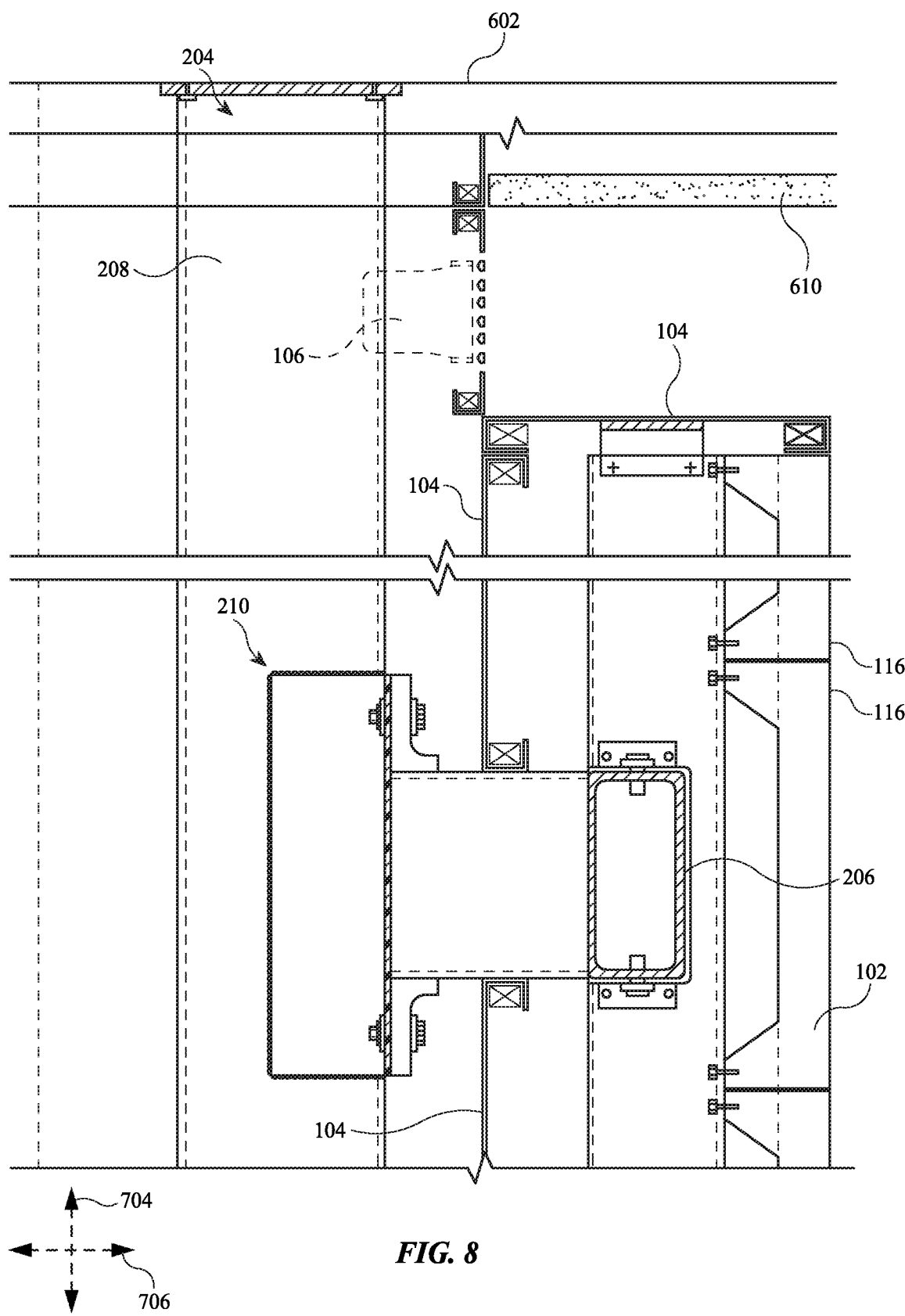
FIG. 8 shows a partial side cut view of a video display system according to an embodiment.

FIG. 8 shows an upper portion of the video display system 10, where upper portion 204 may be anchored. In some cases, a false ceiling may hide a slab to which upper portion 204 may be anchored. FIG. 8 shows portions of outer housing 104, creating an envelope that houses various components of video display system 10. In some embodiments, outer housing 104 may include an access door 112, or a plurality of access doors 112, in order to access systems and components within outer housing 104. In some embodiments, outer housing 104 may be coated with a functional coating, such as a coating to inhibit rust, scratches, fingerprints, etc. In some embodiments a functional coating may increase heat dissipation from the outer housing 104, or may damp vibration or abate structural or airborne noise generated by the video display system 10. In some embodiments, outer housing 104 may include an aesthetic element, such as a color or pattern.

Figure 9:
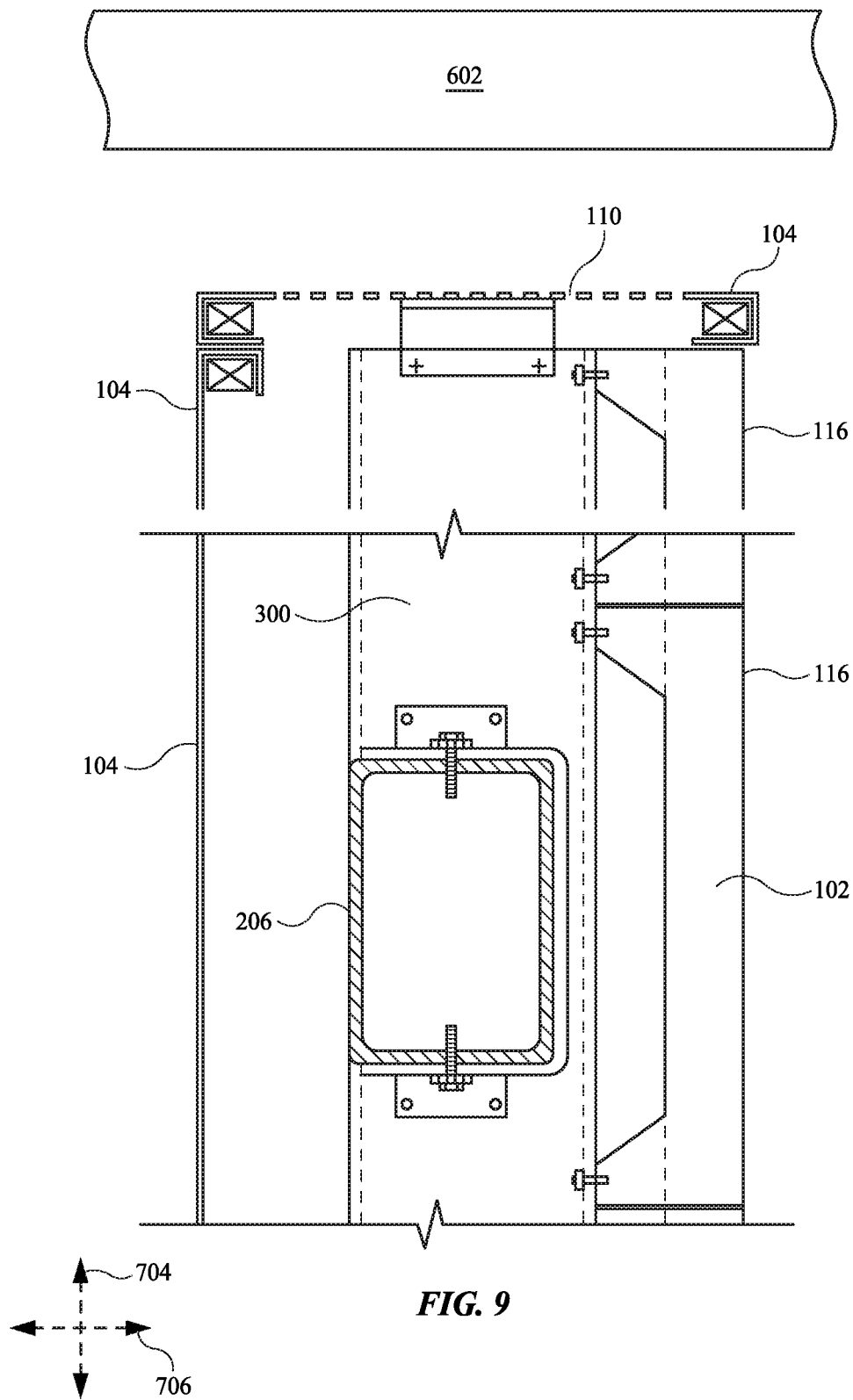
FIG. 9 shows a partial side cut view of a video display system according to an embodiment.

FIG. 9 shows an upper portion of the video display system 10, where video display system 10 may include a support bracket 300 configured to support video display 100, wherein support bracket 300 is coupled to truss 200. FIG. 12 shows a top sectional view showing support brackets 300. In some embodiments, there may be a plurality of support brackets 300 configured to support portions of the individual video display modules 102. As shown in FIG. 9, outer housing may include perforations 110, for example to allow for cooling of the components housed within outer housing 104. In some embodiments, support bracket 300 may be a formed sheet or plate component, and may be attached to the first or second beams 206/208. Support bracket 300 may be made from a structural material, such as a metal, structural polymer, or the like. In some embodiments, support bracket 300 may be attached to first or second beams 206/208, directly or indirectly, for example by utilizing a bracket and fastener system, or may be welded together. Support brackets 300 may include one or more receiving portions to receive a portion of a first beam 206 or a second beam 208. As shown in FIG. 12, for example, a plurality of support brackets 300 having a generally C-shaped cross section when viewed from a top view of the video display system 10 may be included. Support brackets 300 having a generally L-shaped, or generally I-shaped cross section when viewed from a top view of the video display system 10 may also be included.

Figure 10:
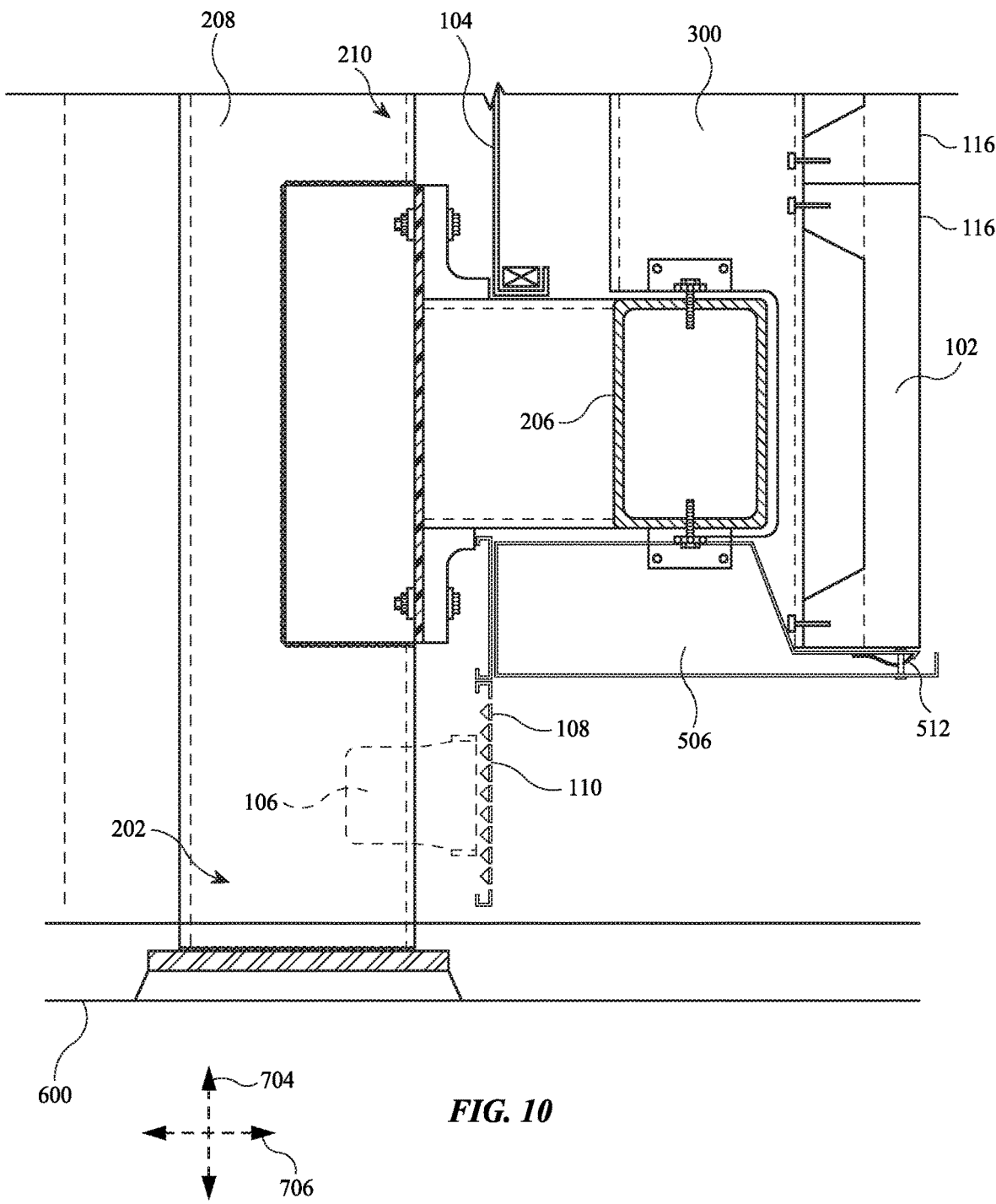
FIG. 10 shows a partial side cut view of a video display system according to an embodiment.
Figure 11:
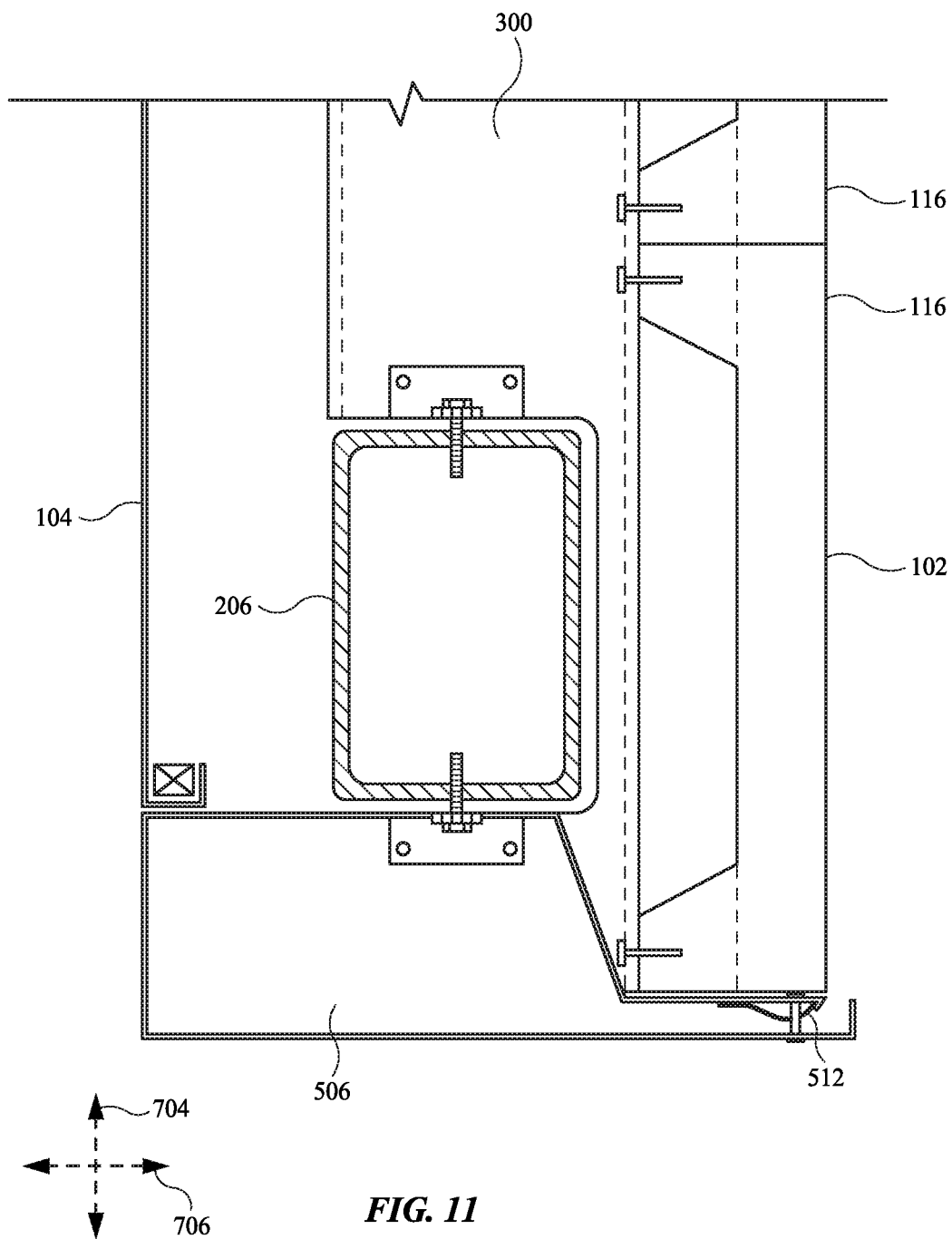
FIG. 11 shows a partial side cut view of a video display system according to an embodiment.

FIG. 10 shows a lower portion of the video display system 10, where lower portion 202 may be anchored to a floor 600. In some cases, a false floor may hide a slab to which lower portion 202 may be anchored.

Figure 18:
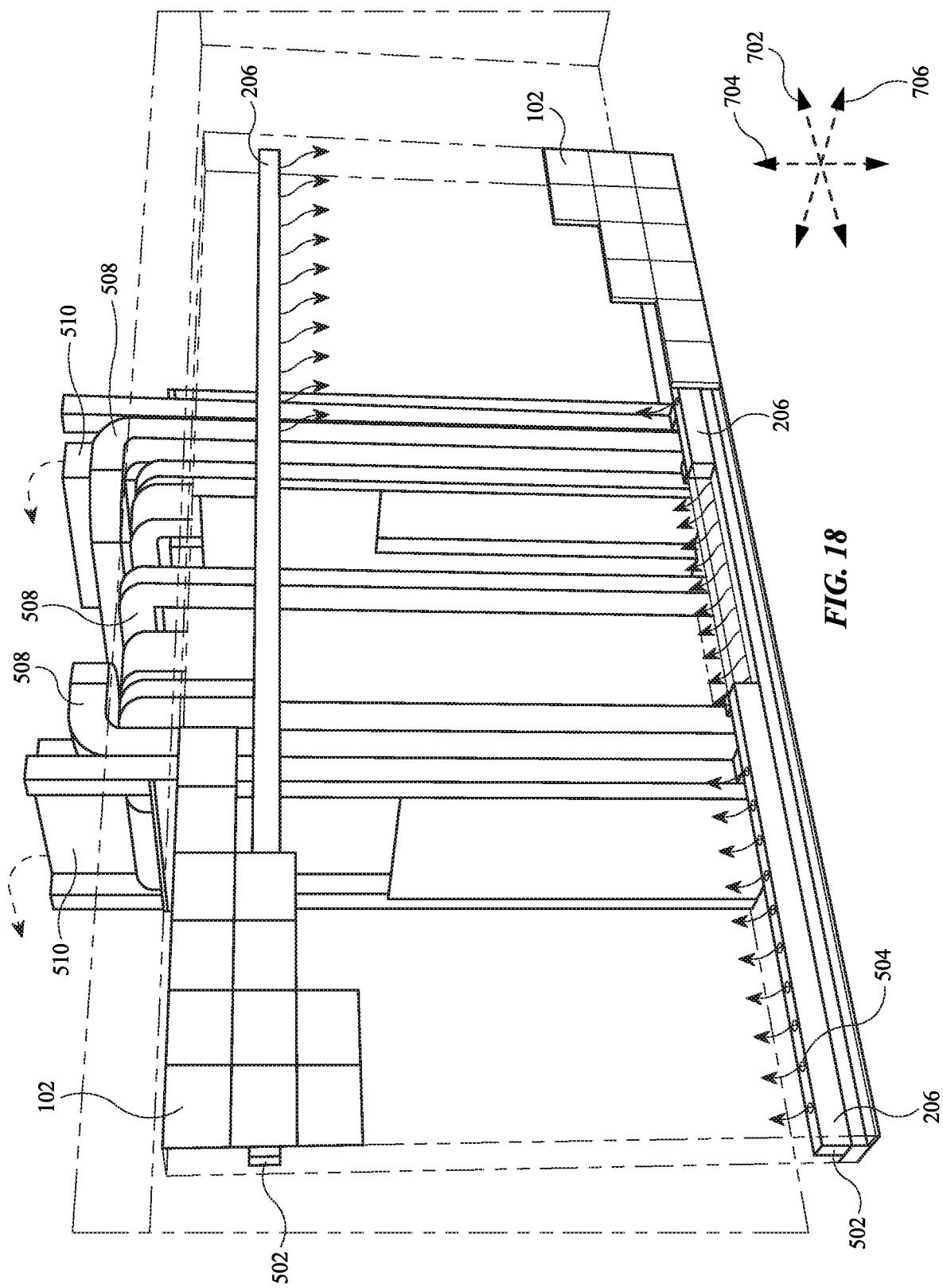
FIG. 18 shows a partial front perspective view of a video display system according to an embodiment.
Figure 19:
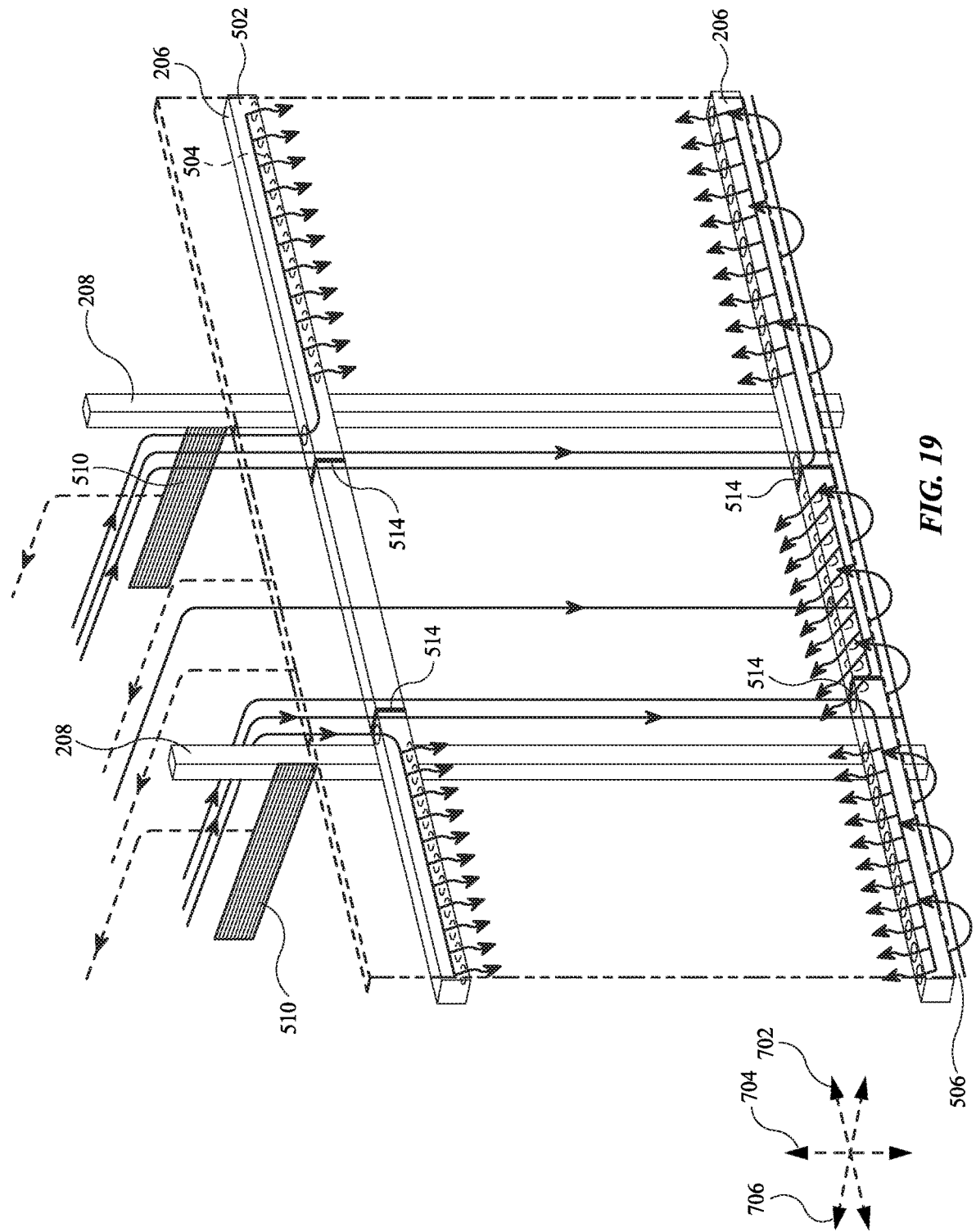
FIG. 19 shows a partial front perspective view of a video display system according to an embodiment.
Figure 20:
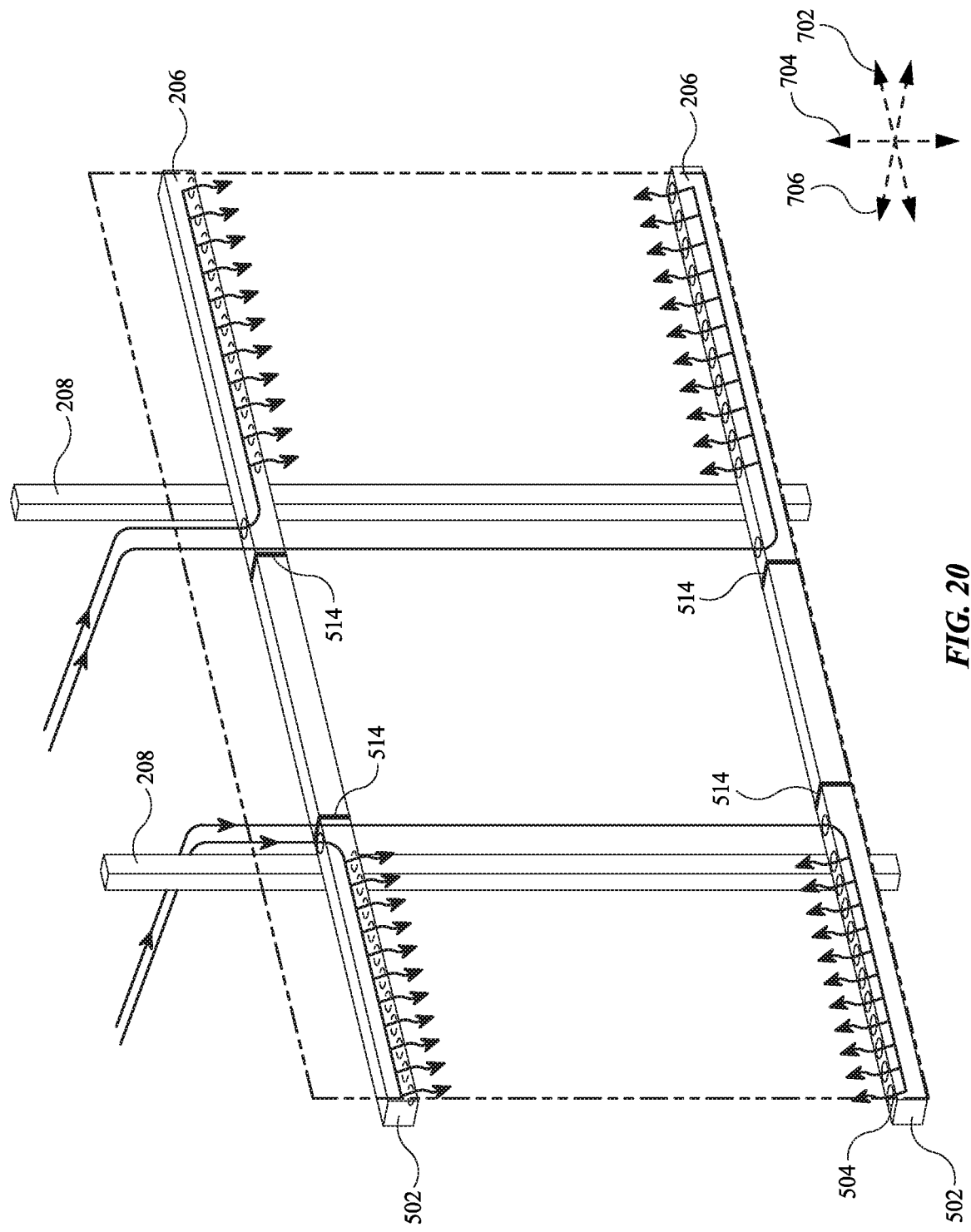
FIG. 20 shows a partial front perspective view of a video display system according to an embodiment.
Figure 21:
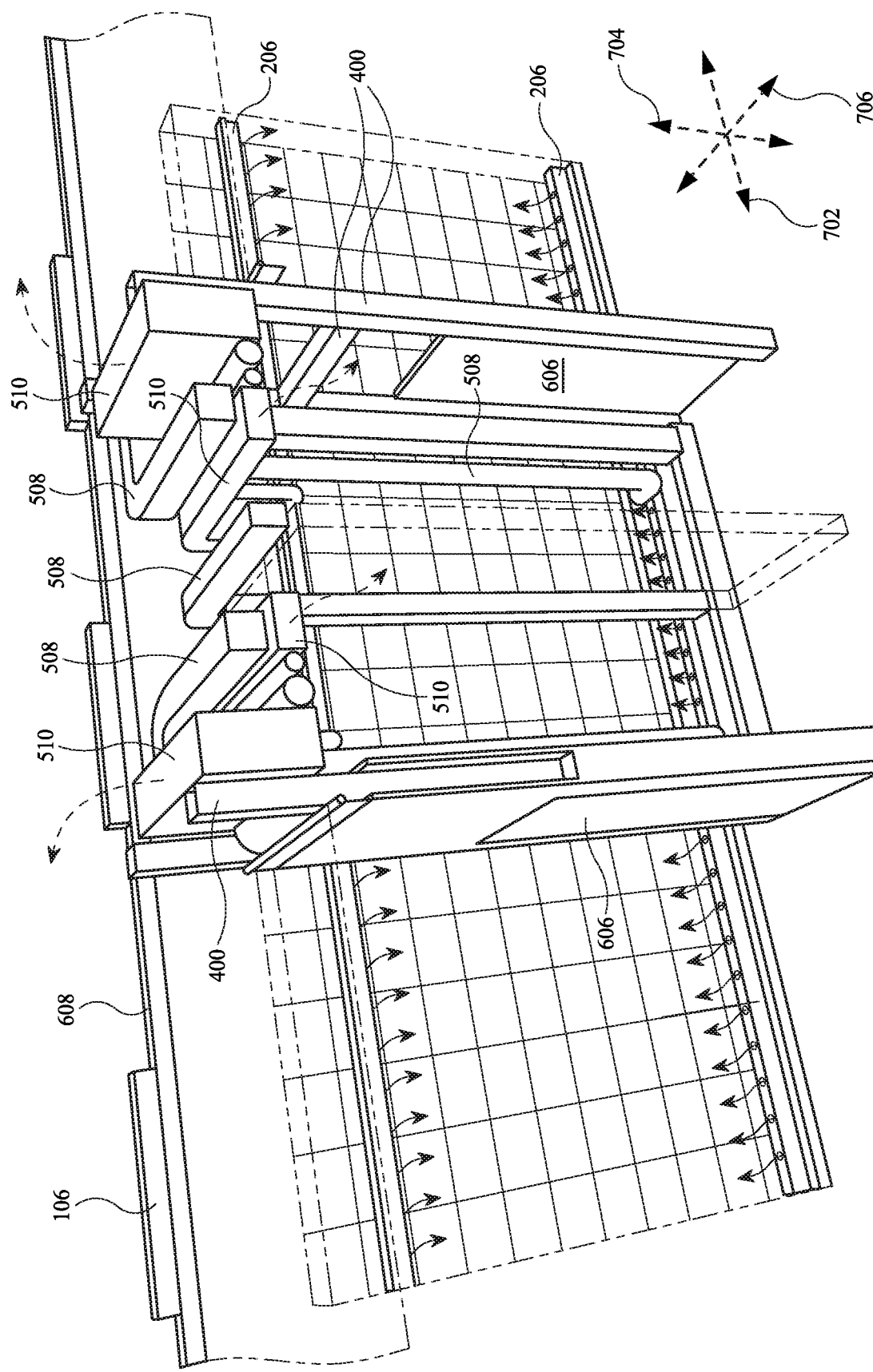
FIG. 21 shows a partial rear perspective view of a video display system according to an embodiment.
Figure 22:
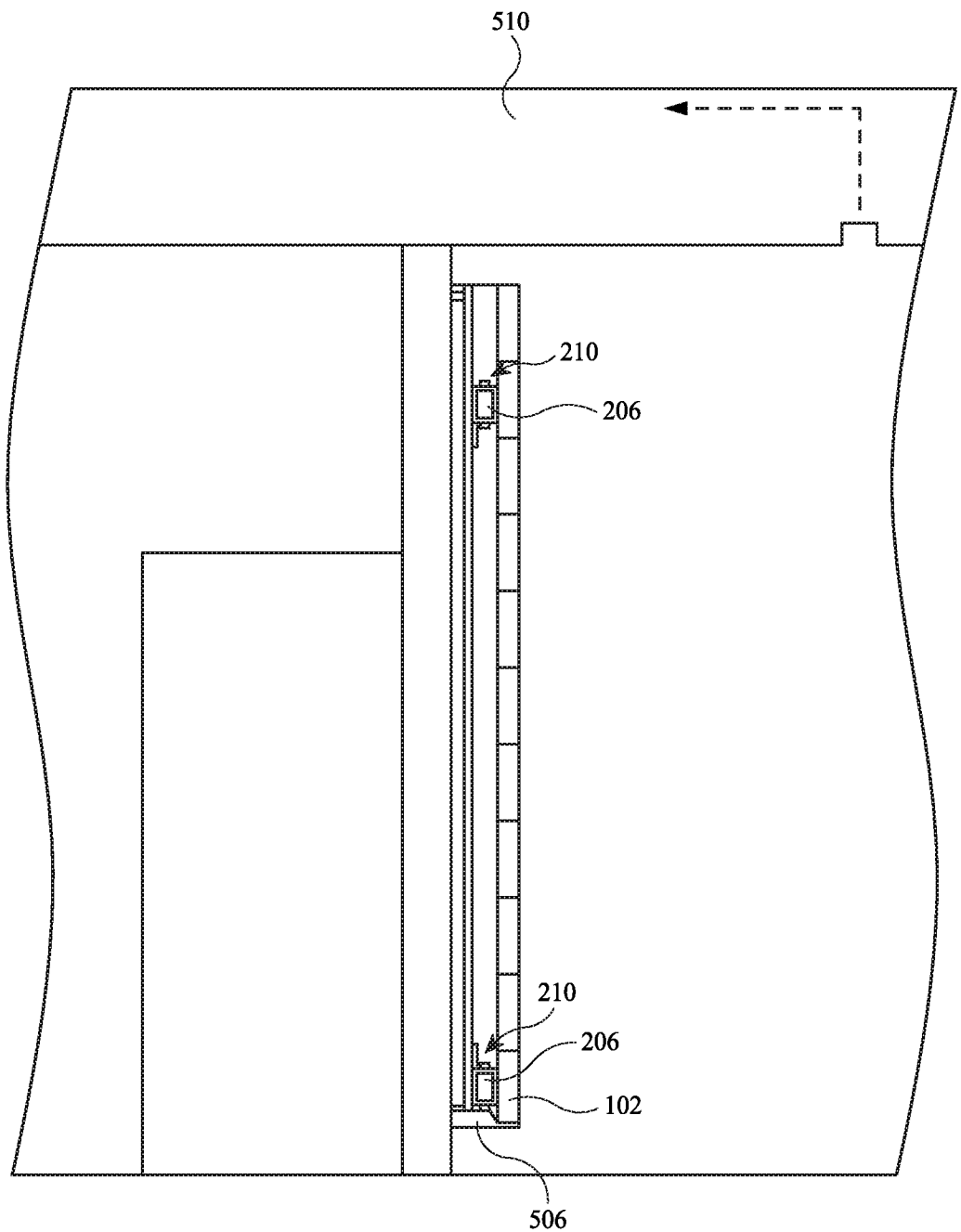
FIG. 22 shows a side schematic view of a video display system to an embodiment.
Figures 23A, 23B:
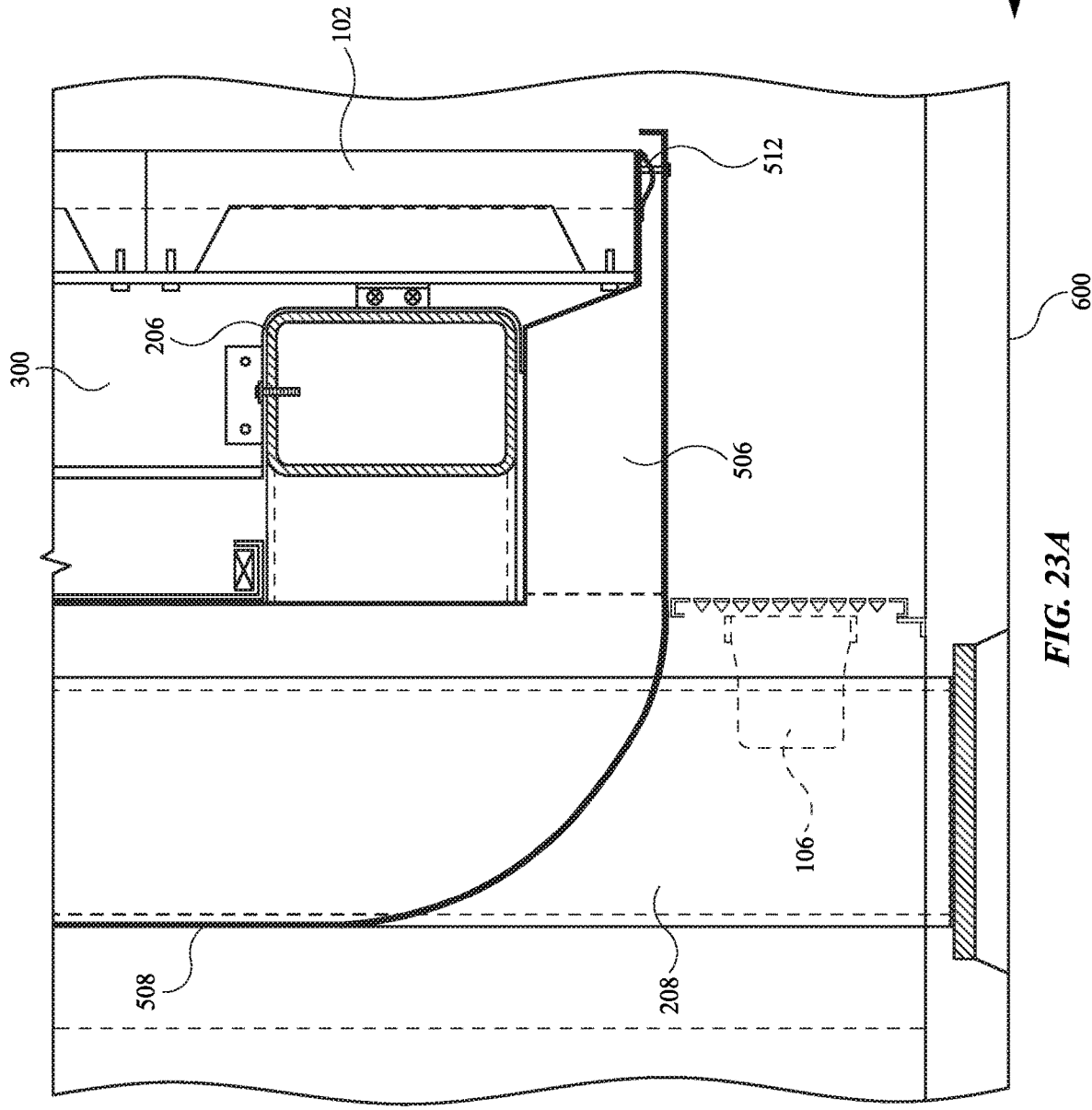
FIG. 23A shows a partial cut view of a video display system according to an embodiment.
FIG. 23B perspective view of a diffuser and supply air duct according to an embodiment.
Figure 24:
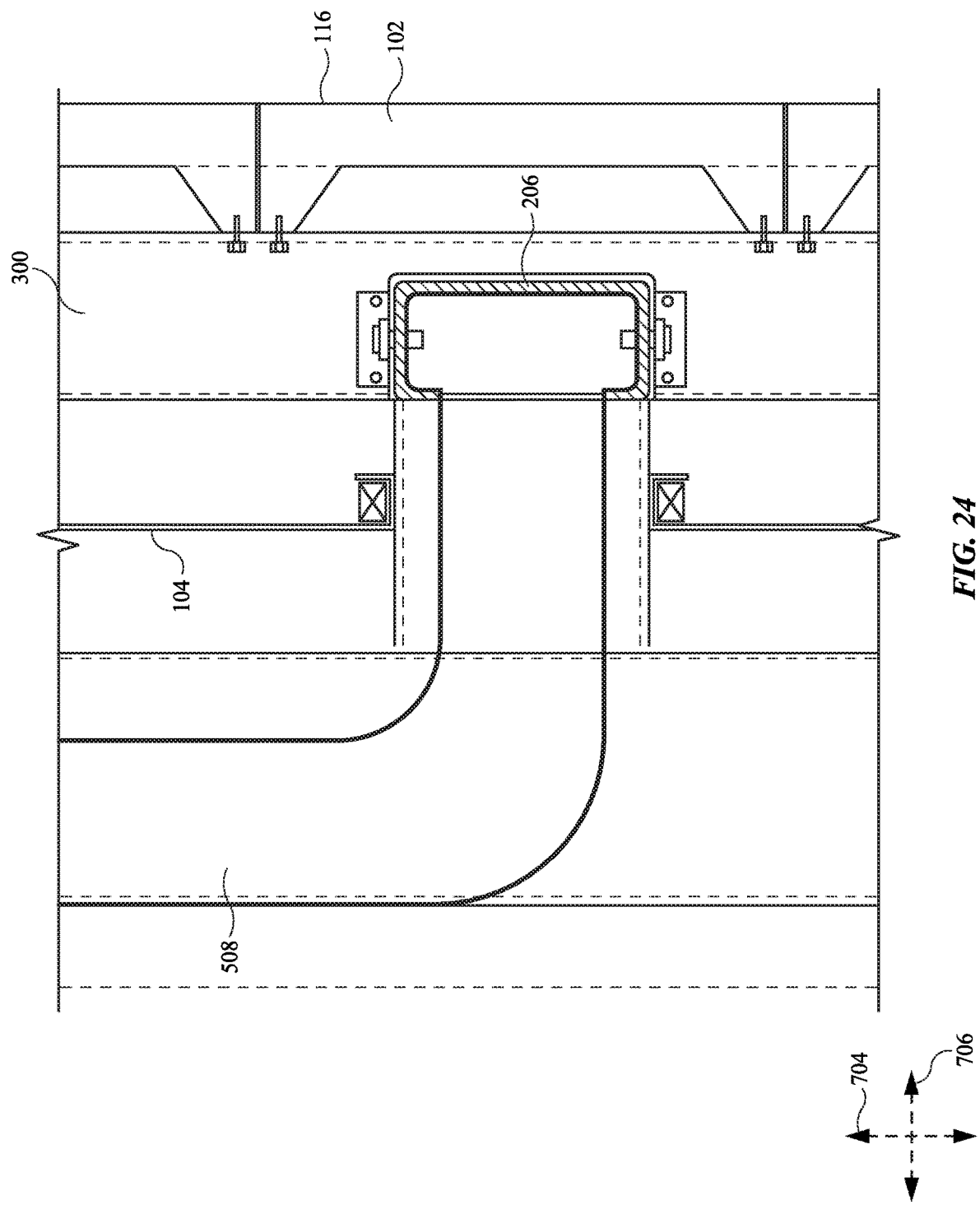
FIG. 24 shows a partial cut view of a video display system according to an embodiment.
Figure 25:
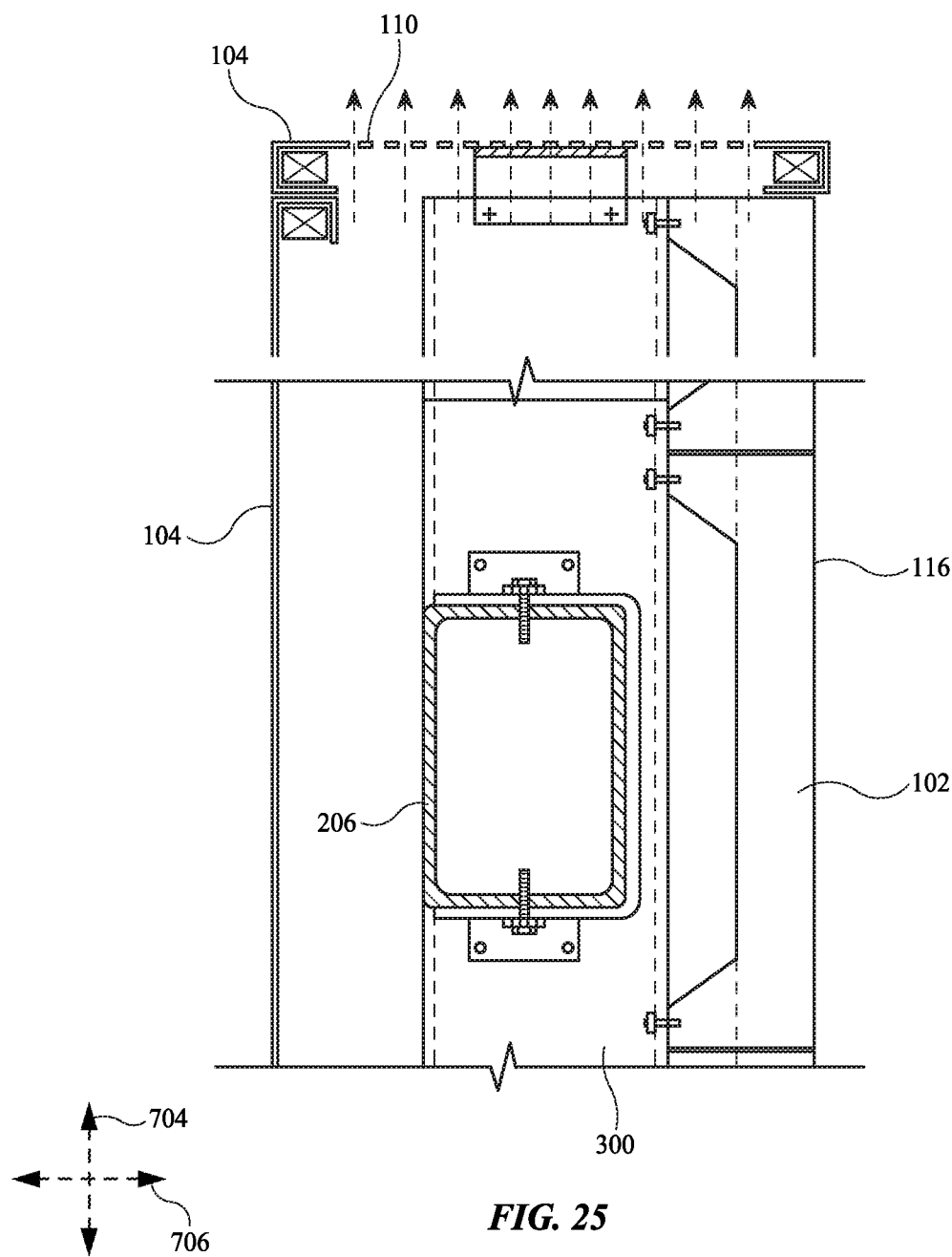
FIG. 25 shows a partial cut view of a video display system according to an embodiment.

Also as shown in FIG. 10, for example, in some embodiments, video display system 10 may include a joint system 210, and the plurality of video display modules 102 may be positioned in an array having multiple horizontal rows. Joint system 210 may be configured to hang the bottom row of video display modules 102, as shown in FIGS. 5A, 5B and 18, for example. Joint system 210 may be coupled to support bracket 300 in some embodiments. In some embodiments, joint system 210 may be coupled to first truss or a second truss 400. In some embodiments, horizontal rows above the bottom row are stacked on top of the bottom row and the rows below each respective horizontal row. In some embodiments, there may be a plurality of joint systems 210 configured to connect to first and second beams 206/208. Joint system 210 may include for example, beams, brackets, shims, spacers, and may be made of suitable structural materials. In some embodiments, joint system 210 may include a polymeric or plastic spacer or pad, which may be configured to properly space the joint system 210 with respect to the truss 400. In some embodiments, joint system 210 may be configured to damp vibration or abate structural or airborne noise generated by the video display system 10.

Figure 13:
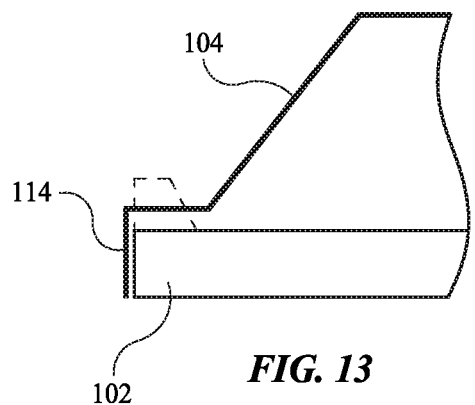
FIGS. 13 and 14 show partial top schematic views of a video display system according to an embodiment.
Figure 14:
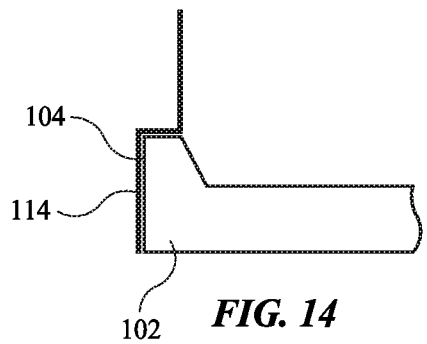
Figure 15:
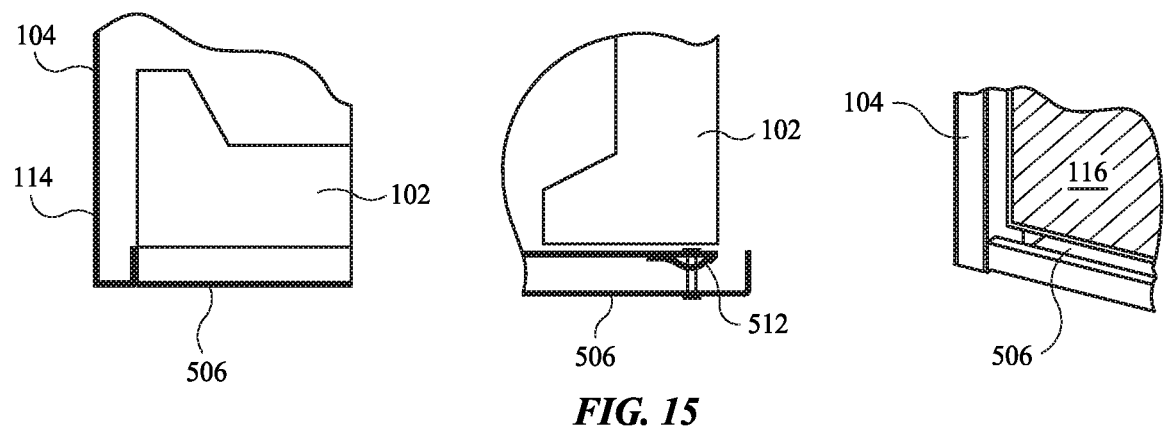
FIGS. 15 and 16 show various section views of a video display system according to embodiments.
Figure 16:
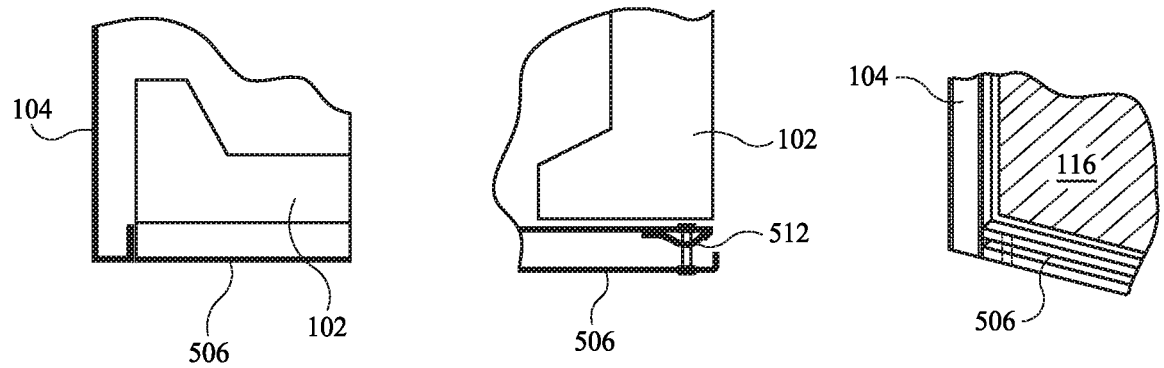

In some embodiments, the video display system 10 may include second truss 400 positioned behind and coupled to the truss 200, defining a space between. Displacing second truss 400 away from truss 200 can help maintain compactness of video display system 10, video display 100 and truss 200, while contributing additional support. For example, second truss 400 may be positioned at least 3 feet away from truss 200. The ability to separately position second truss 400 relative to truss 200 contributes to the flexibility of video display system 10, and allows it to be positioned in many different locations. Truss 400 may include additional beams. The beams may be coupled together, for example, with a bracket system, welding, or other suitable coupling In some embodiments, video display system 10 may include outer housing 104 containing at least a portion of the video display system 10. FIGS. 13 and 14 show top schematic views of embodiments of video display system 10. FIGS. 15-16 show top schematic, lower side schematic, and perspective views of embodiments of video display system 10. With reference to FIGS. 13-16, for example, in some embodiments, outer housing 104 may include a surface tapering towards the center of rear of the video display 100, in some embodiments, the front surface of outer housing 104 is aligned with a front surface of the diffuser 506, in some embodiments, the front surface of the video display 100 is disposed forward of lower portion 202 of truss 200. In some embodiments, the front surface of the video display 100 may be disposed forward of upper portion 204 of truss 200. In embodiments, the front surface of the video display 100 may be disposed forward of lower portion 202 of truss 200.

In some embodiments, lower portion 202 is coupled to video display 100 at a position between terminal sides 114 of video display 100 and spans less than approximately one-third of the length of video display 100. In some embodiments, lower portion 202 is coupled to video display 100 at a position between terminal sides 114 of video display 100 and spans more than approximately one-third of the length of video display 100, but less than approximately two-thirds of the length of video display 100. In some embodiments, lower portion 202 is coupled to video display 100 at a position between terminal sides 114 of video display 100 and spans more than approximately one-third of the length of video display 100 but less than approximately three-fourths of the length of video display 100. In some embodiments, lower portion 202 is coupled to video display 100 at a position between terminal sides 114 of video display 100 and extends such that the portions of video display 100 from the end of the lower portions 202 to the terminal sides 114 of video display 100 are symmetrical along a center of the video display. In some embodiments, the portions of video display 100 from the end of the lower portions 202 to the terminal sides 114 of video display 100 are asymmetrical along a center of the video display. In some embodiments, the upper portion 204 may be positioned the same relative to the lower portion 202, or offset from the lower portion 202.

Figure 17:
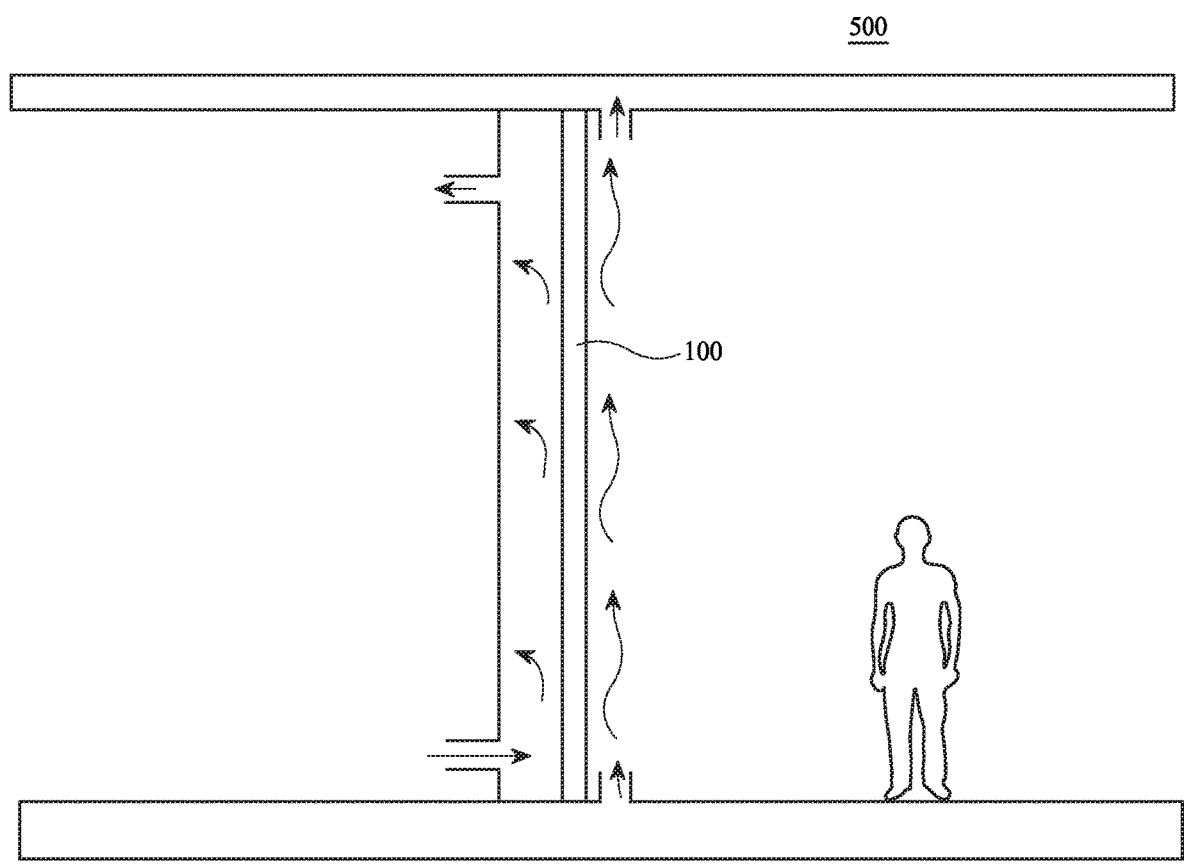
FIG. 17 shows a conceptual view of a cooling system according to an embodiment.

As shown generally in FIGS. 17-21, 23A, 23B, and 24-28, for example, in embodiments, video display system 10 may include a cooling system 500. FIG. 17 shows a conceptual view of a cooling system according to an embodiment. FIG. 17 shows general flow lines of air in cooling system 500, for example through channels at the rear of video display 100 and in front of video display 100. Cooling system 500 may include an air channel, such as an air channel 502. In some embodiments, air channel 502 may be within one of first or second beams 206/208, to contribute to compactness of video display system 10. In some embodiments, air channel 502 may be a separate structure, for example, a ducting insert. In some embodiments, air channel 502 may be integrated with beams 206/208, configured as a passage therein. In some embodiments, beam 206/208 may further include apertures 504 configured to discharge air along the rear of video display modules 102. In some embodiments, there may be a single aperture 504 configured as a channel or slot, for example. In some embodiments, apertures 504 may be spaced intermittently along the length at least one of first or second beams 206/208. In some embodiments, beams 206/207 or air channel 502 may include a sealing member 514 configured to seal a portion of the air channel 502 or direct airflow therein. In some embodiments, apertures 504 may be equally spaced along the length of at least one of first or second beams 206/208, or may be disposed only in a portion of beams 206/208. In some embodiments, apertures 504 may be disposed in a portion of beams 206/208 at a location facing the video display modules 102. In some embodiments, apertures 504 may be disposed in a portion of beams 206/208 at a location closest to the video display modules 102. In some embodiments, video display system 10 may include a diffuser 506 disposed below video display 100 and configured to discharge air upwardly across the screen 116 of video display 100. In some embodiments, beams 206/208 may be configured to discharge air to the front and/or rear of video display 100, or connect to ducting, diffusers, and the like. Diffuser 506 may include apertures 504 configured to discharge air towards the rear of the video display modules. In FIGS. 18-21, 25, and 26-28, supply air flow is shown as solid arrow lines, and return air flow is shown as dotted arrow lines.

Figure 26:
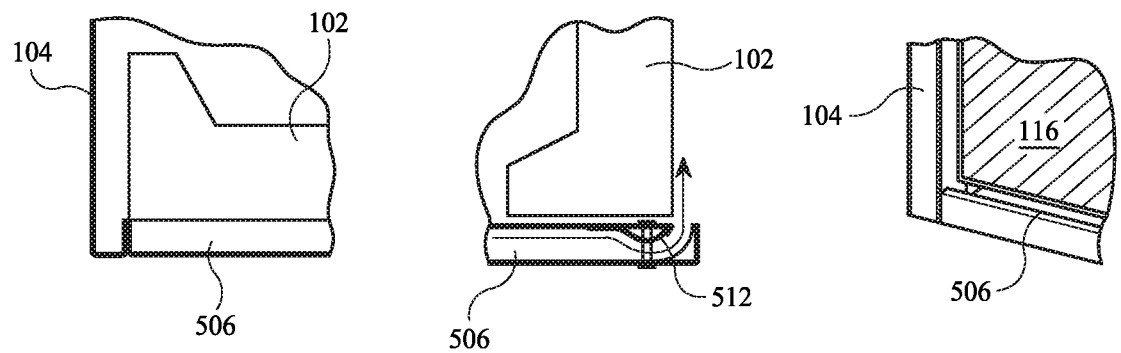
FIGS. 26-28 show various section views of a video display system according to embodiments.
Figure 27:
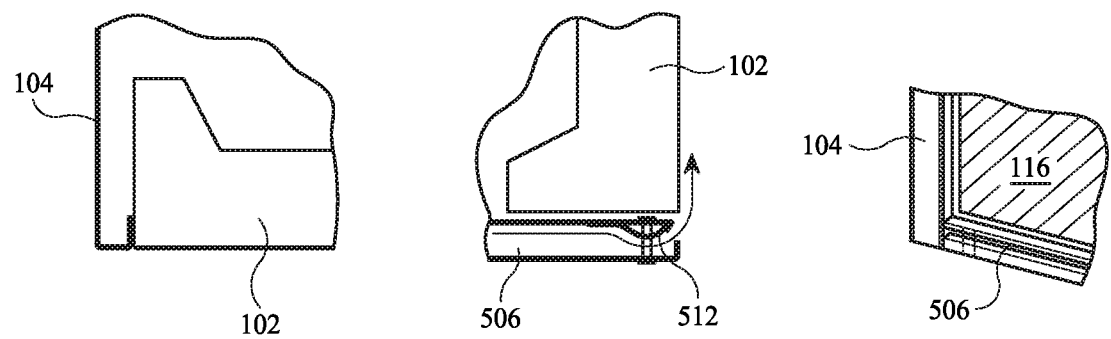
Figure 28:
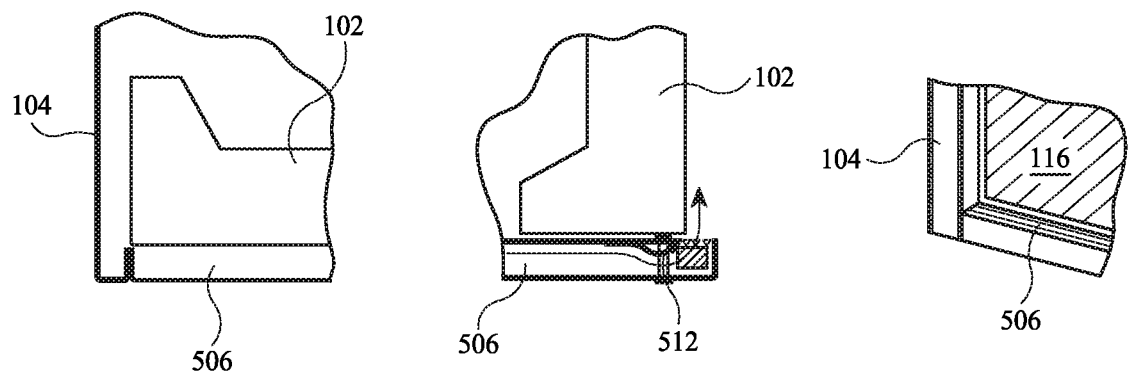

In FIGS. 18-25, for example, cooling system 500 may include a supply air duct 508 and a diffuser 506 coupled to supply air duct 508 and disposed below video display 100 and configured to discharge air upwardly across screen 116 of video display 100. As shown in FIG. 15, for example, in some embodiments, a surface of diffuser 506 may extend beyond the front of video display 100. As shown in FIG. 16, in some embodiments, an edge of diffuser 506 is positioned flush with the front surface of video display 100. Diffuser 506 may create an air curtain surface on the front of video display 100, thereby cooling the screen 116 through convective heat transfer. Advantageously, an individual in front of the screen 116 will not feel hot air blowing towards them in this configuration, as through convection the hot air will continue to rise along the plane of video display 100 and not divert away from video display 100 towards an individual near video display system 10. Relatedly, FIGS. 26-28 show additional views of the relationship between outer housing 104, video display module 102, and diffuser 506.

A return duct 510 may be provided in some embodiments. Return duct 510 may include a plurality of ducts, and may be positioned behind or in front of video display 100, or both. In some embodiments, return duct 510 is integral with a ceiling, and may recirculate air from the front of video display 100 to the rear of video display 100 to further cool the air and recirculate it through cooling system 500.

Some embodiments are drawn to truss 200 for supporting video display 100, including a first beam 206, a second beam 208 configured to extend parallel with a front surface of video display 100 and coupled to first beam 206, and a support bracket 300 coupled to truss 200 and configured to support a plurality of video display modules 102 of video display 100. In embodiments, support bracket 300 may include a plurality of support brackets 300. In some embodiments, first beam 206 may include an air channel 502, and apertures 504 configured to allow air to flow from the air channel 502 to an environment.

Some embodiments are drawn towards cooling system 500, including an air channel 502 disposed within a beam, the beam further including apertures 504 configured to discharge air from air channel 502 to an environment, diffuser 506 disposed below video display 100, diffuser 506 configured to discharge air upwardly across the screen 116 of video display 100. As shown in FIGS. 26-28, for example, diffuser 506 and outer housing 104 may have various configurations. In some embodiments diffuser 506 may include a flow normalizer, filter, or the like. In some embodiments, a surface of diffuser 506 extends beyond the front of video display 100. In some embodiments, an edge of the diffuser 506 is positioned flush with the front surface of the video display 100. In some embodiments, diffuser 506 further includes a Coanda surface 512 disposed proximate the lower edge of the video display 100.

The Coanda effect is the tendency of a fluid jet to be attracted to a nearby surface. As used herein, a Coanda surface may be taken to be a surface that provides a fluid jet to be attracted to a nearby surface, e.g., video display 100. In this regard, a jet of fluid may be configured to change direction, even if the Coanda surface curves away from the original direction of the jet. Coanda surface 512 may include, for example, a curved surface disposed within diffuser 506. In some embodiments, Coanda surface 512 may be disposed externally from diffuser 506. Coanda surface 512 may be disposed, for example, on the upper internal surface of diffuser 506. In some embodiments, Coanda surface 512 may be a concave surface, or a convex surface. In some embodiments, Coanda surface 512 may be a plurality of Coanda surfaces. In some embodiments, Coanda surface 512 may be a separate component. In embodiments, Coanda surface may be integrated with or a portion of diffuser 506 or the like.

In some embodiments, cooling system 500 may include a supply air duct 508 configured to couple to air channel 502 and discharge air therein. In some embodiments, cooling system 500 may include a return air duct 510 configured to intake air that has been discharged from one of apertures 504 or diffuser 506. In some embodiments, cooling system 500 may include supply air duct 508 configured to couple to air channel 502 and discharge air therein, and return air duct 510 configured to intake air that has been discharged from one of apertures 504 or diffuser 506. In some embodiments, airflow may be configured to selectively contact various portions of video display system 10.

Some embodiments are drawn towards a method for cooling a video display, including supplying an airflow across the front of video display 100 originating proximate the lower edge of the video display 100 utilizing a Coanda surface 512 disposed within a diffuser.

FIG. 29 shows a video display system 20, which does not include a door, but may include other means to access the rear portions of video display system 20. Characteristics of video display system 10 described herein may also apply to video display system 20 in some embodiments, and characteristics of video display system 20 described herein may also apply video display system 10 in some embodiments.

Figure 30:
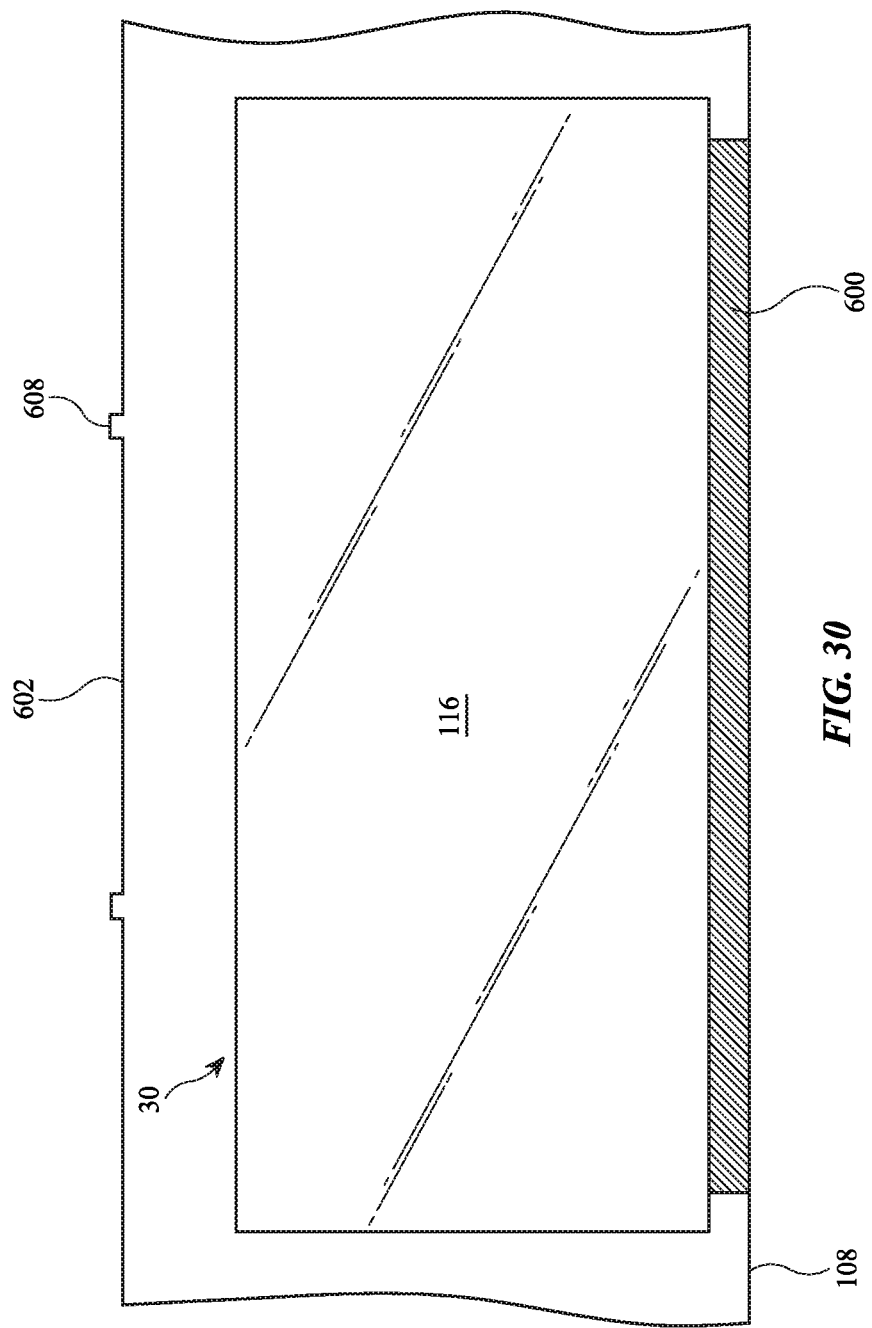
FIG. 30 shows a front view of a video display system according to an embodiment.
Figure 31:
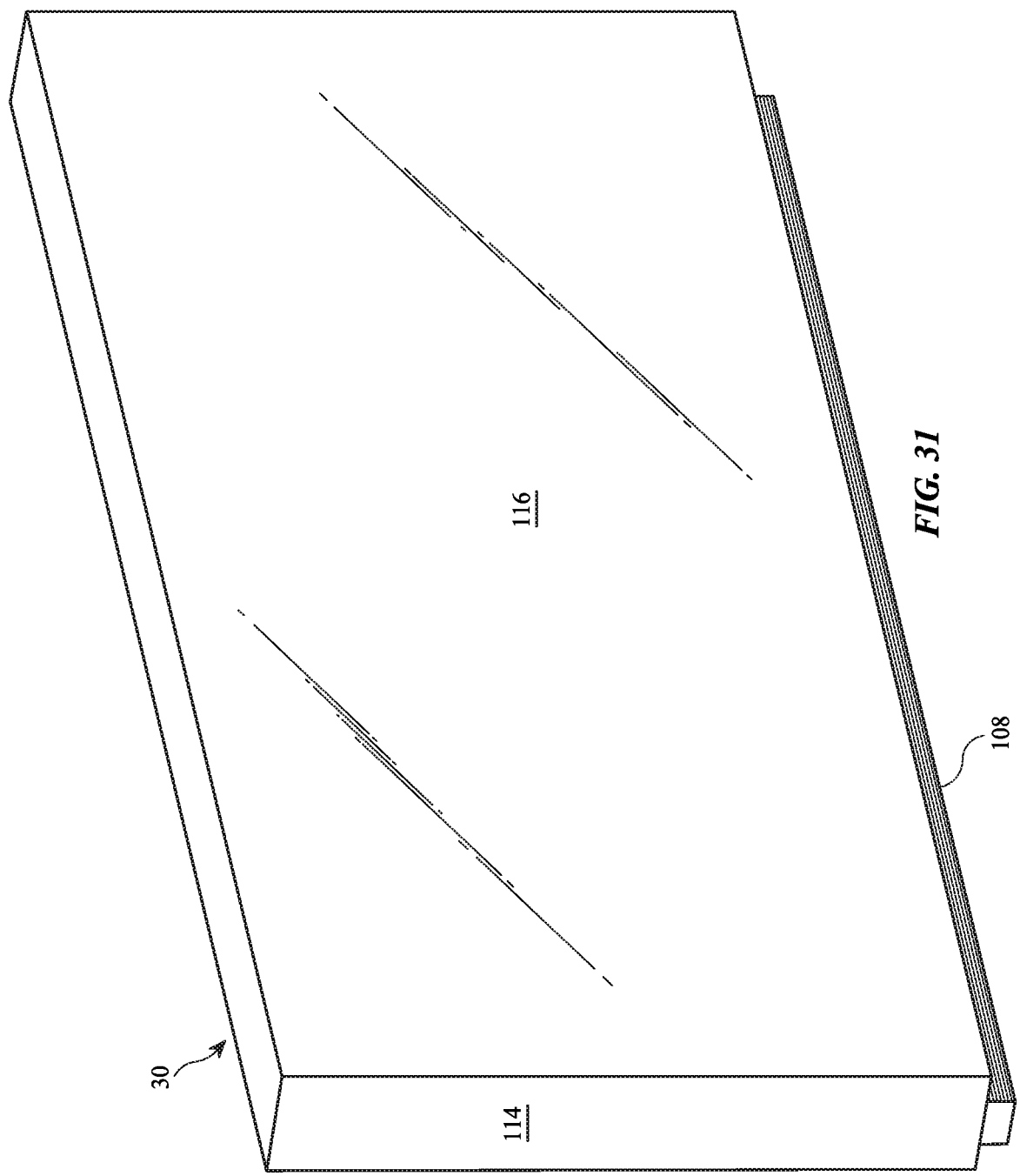
FIG. 31 shows a front perspective view of a video display system according to an embodiment.
Figure 32:
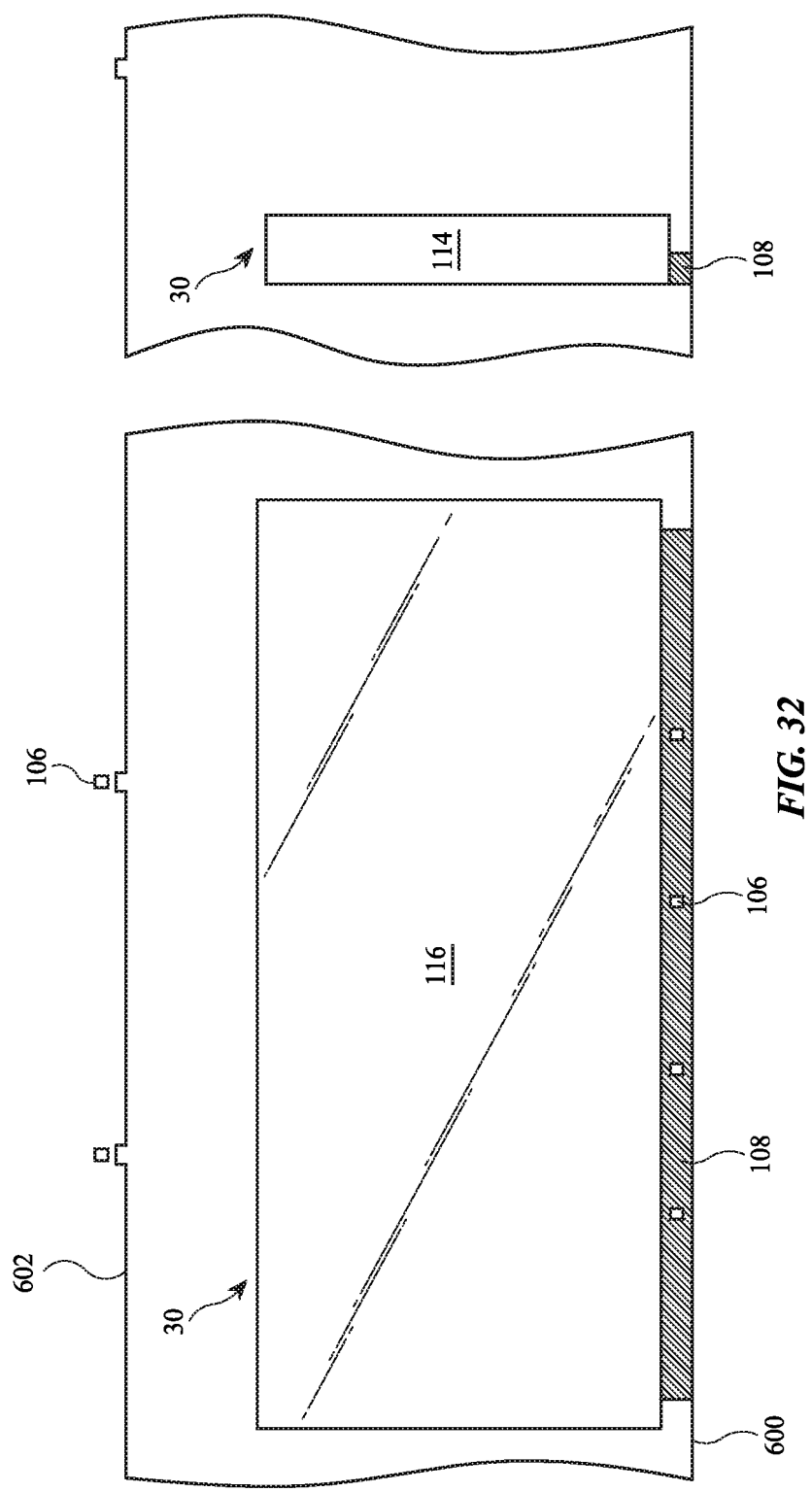
FIG. 32 shows a front and side view of a video display system according to an embodiment.
Figure 33:
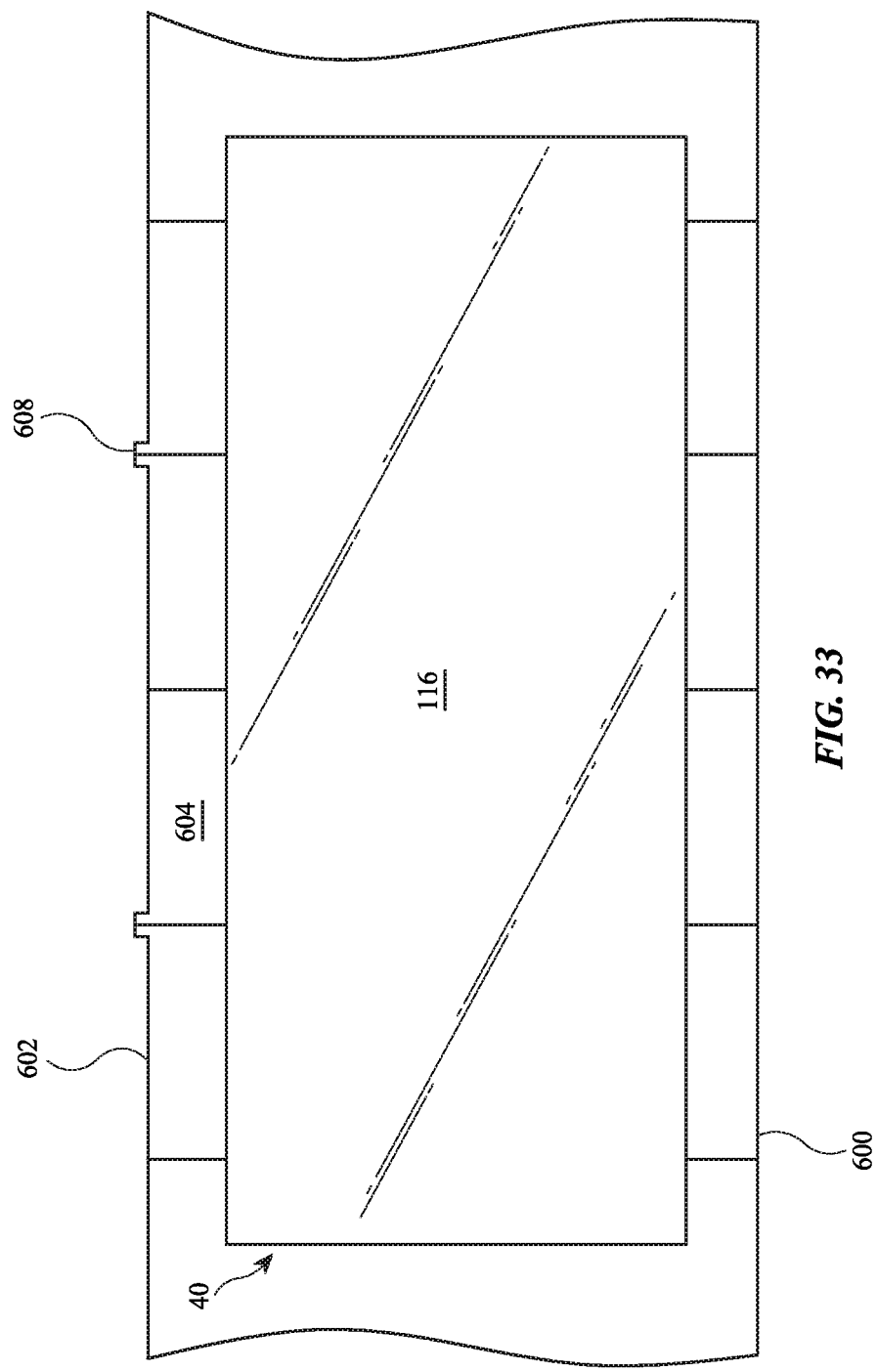
FIG. 33 shows a front view of a video display system according to an embodiment.
Figure 34:
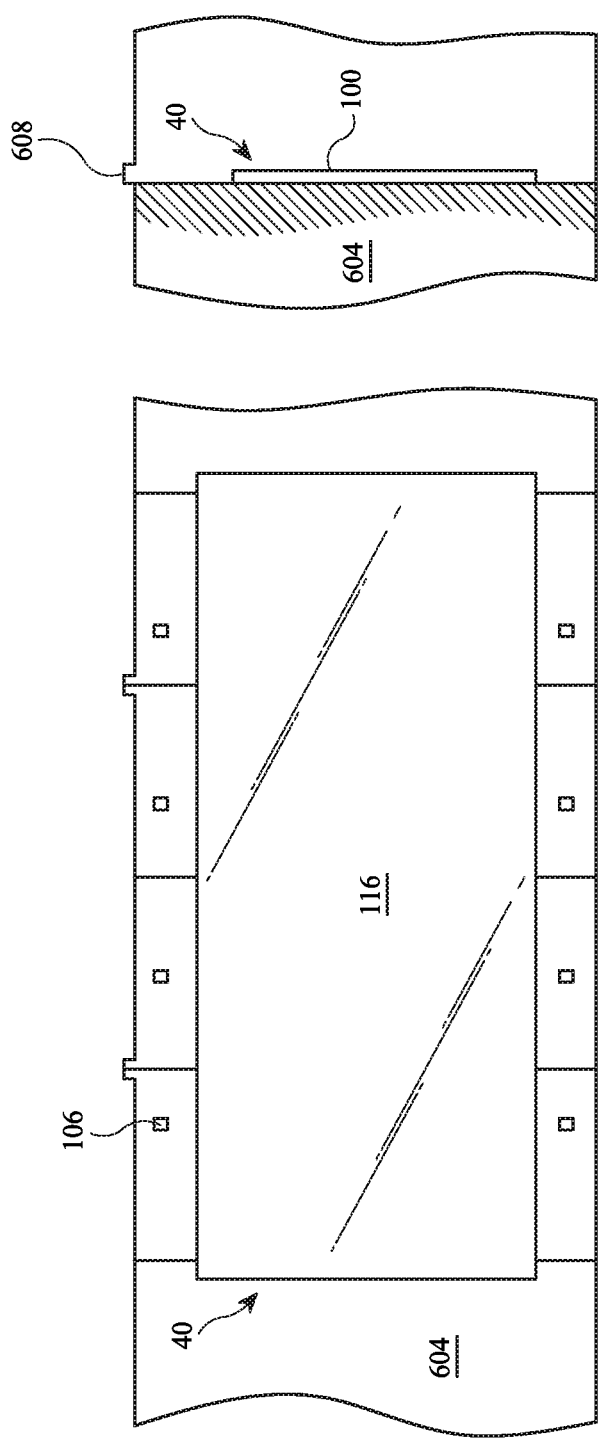
FIG. 34 shows a front and side view of a video display system according to an embodiment.
Figure 35:
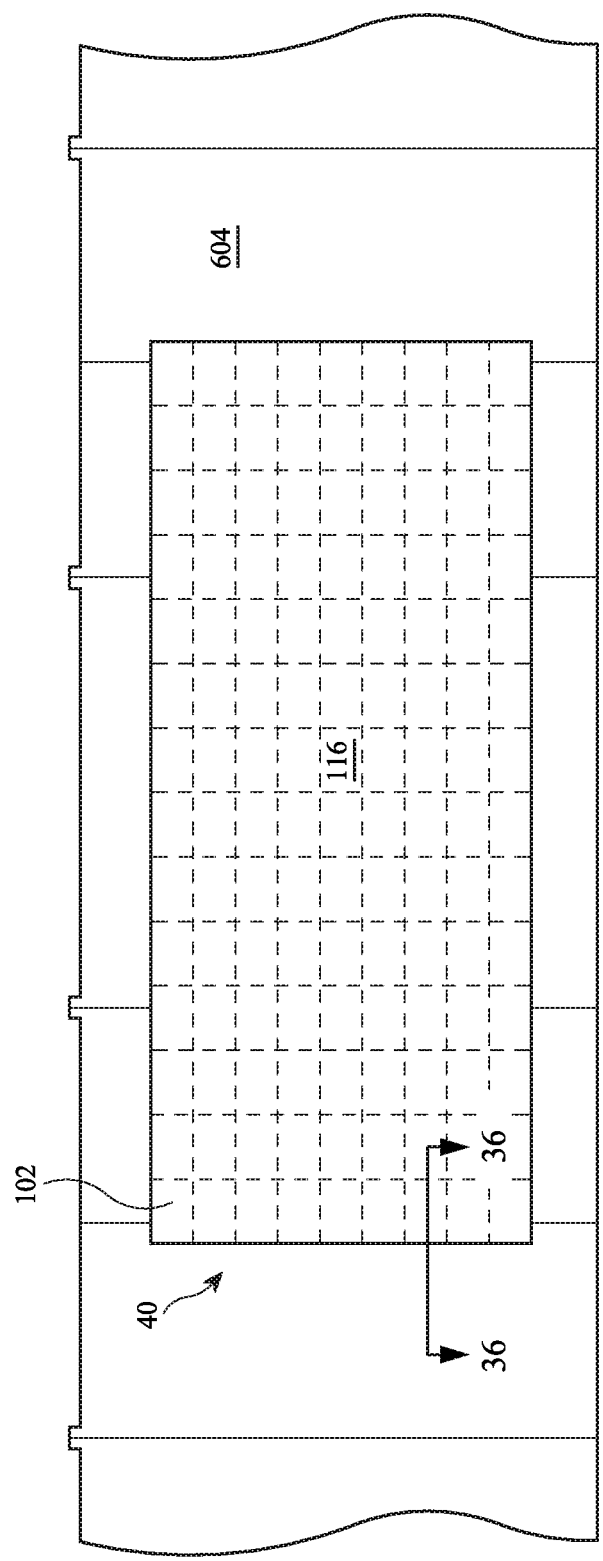
FIG. 35 shows a front schematic view of a video display system according to an embodiment.
Figure 36:
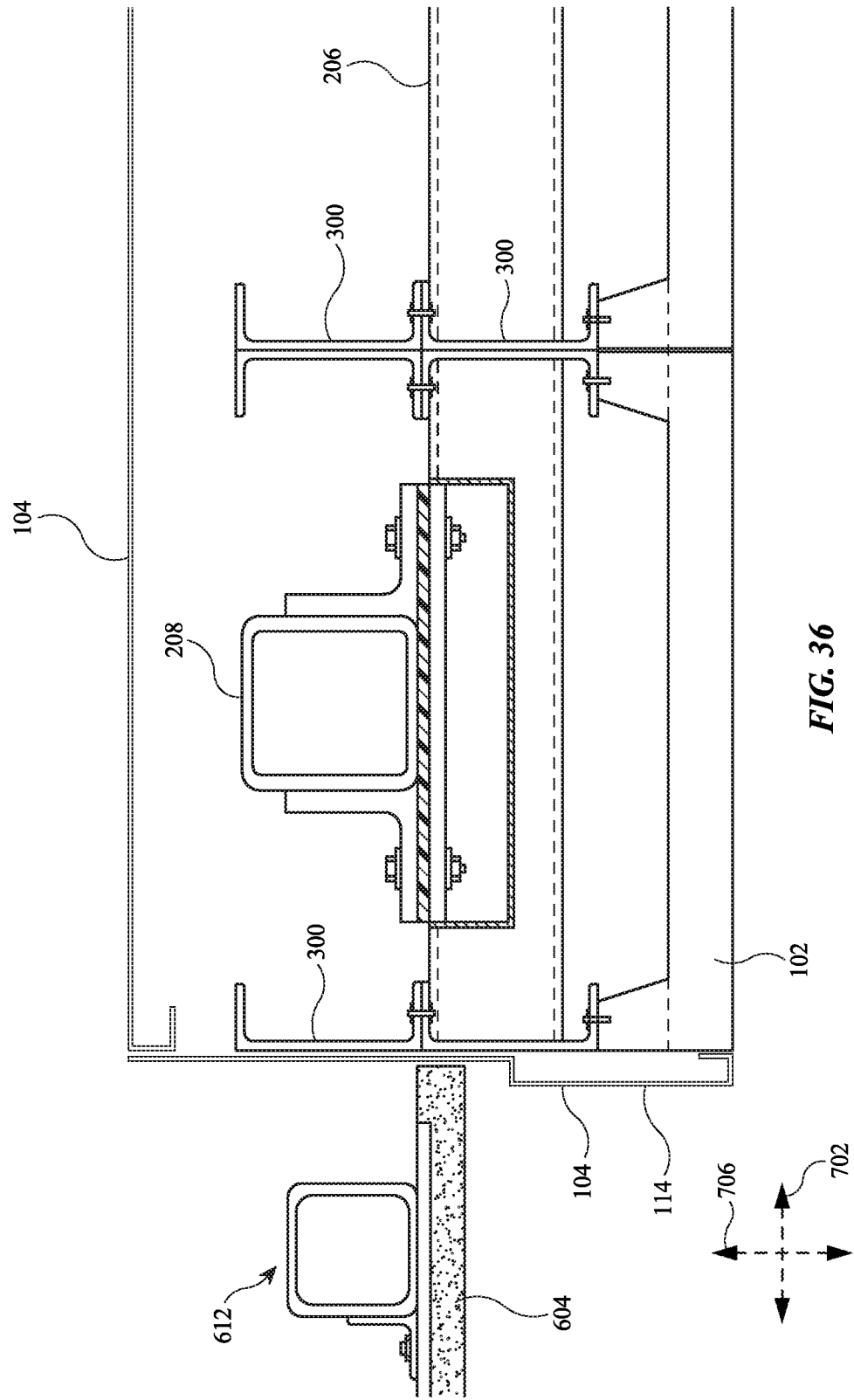
FIG. 36 shows a partial cut view of a video display system according to an embodiment.

FIGS. 30-32 show a video display system 30, which is only supported at the lower portion. Characteristics of video display systems 10 and 20 described herein may also apply to video display system 300 in some embodiments, and characteristics of video display system 30 described herein may also apply video display systems 10 and 20 in some embodiments. In some embodiments, video display system 30 may include access below floor 600 in order to service and maintain various components of video display system 30.

FIGS. 33-36 show a video display system 40, which may be partially embedded in a wall. Characteristics of video display system 10, 20, and 30 described herein may also apply to video display system 40 in some embodiments, and characteristics of video display system 40 described herein may also apply video display systems 10, 20, and 30 in some embodiments.

In some embodiments, the spacing between portions along with the length of component module housing may vary according to the number or configuration of support of the system. For example, in some embodiments, if two supports are utilized the respective distance between supports may be shorter than if only one is utilized.

In some embodiments, there may be no more than two first or second beams. In some embodiments there may be fewer or more than two first or second beams.

The foregoing descriptions of the specific embodiments described herein are presented for purposes of illustration and description. These exemplary embodiments are not intended to be exhaustive or to limit the embodiments to the precise forms disclosed. All specific details described are not required in order to practice the described embodiments.

It will be apparent to one of ordinary skill in the art that many modifications and variations are possible in view of the above teachings, and that by applying knowledge within the skill of the art, one may readily modify and/or adapt for various applications such specific embodiments, without undue experimentation, without departing from the general concept of the present invention. Such adaptations and modifications are intended to be within the meaning and range of equivalents of the disclosed embodiments, based on the teaching and guidance presented herein.

The Detailed Description section is intended to be used to interpret the claims. The Summary and Abstract sections may set forth one or more but not all exemplary embodiments of the present invention as contemplated by the inventor(s), and thus, are not intended to limit the present invention and the claims.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The phraseology or terminology used herein is for the purpose of description and not limitation, such that the terminology or phraseology of the present specification is to be interpreted by the skilled artisan.

The breadth and scope of the present invention should not be limited by any of the above-described exemplary embodiments, but should be defined in accordance with the claims and their equivalents.

What is claimed is:

1. A video display system, comprising:
    a video display comprising a plurality of video display modules; and
    a truss coupled to a rear of the video display, wherein a lower portion of the truss is anchored to a floor,
    wherein the lower portion is coupled to the video display at a position between terminal sides of the video display and spans approximately one third of a length of the video display.

2. The system of claim 1, wherein an upper portion of the truss is anchored to a ceiling, wherein the upper portion is coupled to the video display at a position between the terminal sides of the video display and spans approximately one third of the length of the video display.

3. The system of claim 1, wherein the video display is positioned entirely in front of the truss.

4. The system of claim 1, wherein the truss comprises:
    a pair of first beams extending horizontally and parallel with a front surface of the video display,
    a pair of second beams extending vertically and parallel with the front surface of the video display and coupled to the first beams.

5. The system of claim 4, comprising a cooling system, wherein the cooling system comprises:
    an air channel within at least one of the first or second beams, the beam comprising an aperture configured to discharge air along the rear of the video display modules.

6. The system of claim 1, comprising:
    a support bracket coupled between the video display and the truss.

7. The system of claim 1, further comprising a second truss positioned behind and coupled to the first truss, defining a space between the first truss and the second truss.

8. The system of claim 1, further comprising an outer housing containing at least a portion of the video display system, the outer housing comprising a surface tapering towards the center of a rear of the video display.

9. The system of claim 1, further comprising an outer housing containing at least a portion of the video display system, wherein the front surface of the outer housing is aligned with the front surface of the video display.

10. The system of claim 1, wherein the front surface of the video display is disposed forward of the lower portion of the truss by more than approximately 6 inches.

11. The system of claim 2, wherein the front surface of the video display is disposed forward of the upper portion of the truss by more than approximately 6 inches.

12. The system of claim 11, wherein the front surface of the video display is disposed forward of the lower portion of the truss.

13. The system of claim 1, further comprising:
a joint system coupled to a support bracket, wherein the plurality of video display modules are positioned in an array having multiple horizontal rows, and wherein the joint system is configured to hang the bottom row of the video display modules.

14. The system of claim 13, wherein the horizontal rows above the bottom row are stacked on top of the bottom row and the rows below each respective horizontal row.

15. The system of claim 1, wherein the lower portion is coupled to the video display at a position between the terminal sides of the video display and spans less than approximately one third of the length of the video display.

16. The system of claim 1, wherein the lower portion is coupled to the video display at a position between the terminal sides of the video display and spans more than approximately one third of the length of the video display, but less than approximately two thirds of the length of the video display.

17. The system of claim 1, wherein the lower portion is coupled to the video display at a position between the terminal sides of the video display and spans more than approximately one third of the length of the video display but less than approximately three fourths of the length of the video display.

18. The system of claim 1, wherein the lower portion is coupled to the video display at a position between the terminal sides of the video display and extends such that portions of video display from an end of the lower portions to the terminal sides of the video display are symmetrical along a center of the video display.

19. A truss for supporting a video display, comprising:
a first beam comprising:
an air channel; and
apertures configured to allow air to flow from the air channel to an environment;
a second beam configured to extend parallel with a front surface of the video display and coupled to the first beam; and
a support bracket coupled to the truss and configured to support a plurality of video display modules of the video display.

20. A cooling system for a video display, the cooling system comprising:
an air channel disposed within a beam supporting weight of the video display, the beam further comprising apertures configured to discharge air from the air channel to a rear of the video display.

21. The system of claim 5, further comprising:
a return air duct disposed above the video display configured to intake air that has been discharged from the cooling system.

22. The truss for supporting a video display of claim 19, wherein the apertures are configured to direct cooled air towards a rear surface of the video display.

23. The truss for supporting a video display of claim 19, wherein the first beam includes a sealing member configured to seal a portion of the air channel and direct airflow therein.

24. The truss for supporting a video display of claim 19, wherein the second beam further comprises:
a second air channel; and
second apertures configured to allow air to flow from the second air channel to the environment.

25. The truss for supporting a video display of claim 19, wherein the beams are disposed within a housing such that the video display appears to be only supported at a lower portion thereof.

26. The cooling system of claim 20, wherein the video display has a height between 6 feet and 25 feet.

27. The cooling system of claim 20, further comprising a return air duct configured to intake air from outside the air channel into the cooling system.

28. The cooling system of claim 20, further comprising a second beam extending perpendicular to the first beam, wherein the air channel is also disposed within the second beam.

29. The cooling system of claim 20, further comprising a second beam extending in parallel to the first beam, wherein the air channel is also disposed within the second beam.

* * * * *